United States Patent
Neal et al.

(10) Patent No.: US 11,804,418 B2
(45) Date of Patent: Oct. 31, 2023

(54) DIRECT LIQUID MICRO JET (DLMJ) STRUCTURES FOR ADDRESSING THERMAL PERFORMANCE AT LIMITED FLOW RATE CONDITIONS

(71) Applicant: Intel Corporation, Santa Clara, CA (US)

(72) Inventors: Nicholas Neal, Gilbert, AZ (US); Je-Young Chang, Phoenix, AZ (US); Jae Kim, Chandler, AZ (US); Ravindranath Mahajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1145 days.

(21) Appl. No.: 16/246,311

(22) Filed: Jan. 11, 2019

(65) Prior Publication Data

US 2020/0227341 A1    Jul. 16, 2020

(51) Int. Cl.
| | |
|---|---|
| *H05K 7/20* | (2006.01) |
| *H01L 23/433* | (2006.01) |
| *F28F 3/12* | (2006.01) |
| *F28F 9/00* | (2006.01) |
| *H01L 23/367* | (2006.01) |
| *H01L 23/473* | (2006.01) |

(Continued)

(52) U.S. Cl.
CPC ............ *H01L 23/4336* (2013.01); *F28F 3/12* (2013.01); *F28F 9/001* (2013.01); *F28F 9/0202* (2013.01); *H01L 23/367* (2013.01); *H01L 23/4735* (2013.01); *H05K 7/20254* (2013.01); *F28D 2021/0029* (2013.01); *F28F 2260/02* (2013.01)

(58) Field of Classification Search
CPC ..... F28D 2021/0029; F28F 3/12; F28F 9/001; F28F 9/0202; F28F 2260/02; G06F 1/20; G06F 1/203; H01L 23/367; H01L 23/4336; H01L 23/4735; H05K 7/20254; H05K 7/20509
See application file for complete search history.

(56) References Cited

U.S. PATENT DOCUMENTS

| | | | | |
|---|---|---|---|---|
| 5,016,090 A | * | 5/1991 | Galyon | ............... H01L 23/4336 257/714 |
| 9,477,275 B2 | | 10/2016 | Choudury et al. | |

(Continued)

*Primary Examiner* — Jacob R Crum
(74) *Attorney, Agent, or Firm* — Essential Patents Group, LLP

(57) ABSTRACT

A heat exchange module, comprising an array of microchannels, where the array of microchannels extends in a first direction, and are separated from one another by a first sidewall. The array of microchannels is over a cold plate. A first array of fluid distribution channels is stacked over the array of microchannels and extend in a second direction that is substantially orthogonal to the first direction. The first array of fluid distribution channels extends from the first manifold and terminate between a first manifold and a second manifold. A second array of fluid distribution channels is stacked over the array of microchannels. The first array of fluid distribution channels and the second array of the fluid distribution channels are fluidically coupled to the microchannel array. A wall extends into the microchannel array below a second sidewall separating ones of the first array and ones of the second array of fluid distribution channels.

20 Claims, 14 Drawing Sheets

(51) Int. Cl.
*F28F 9/02* (2006.01)
*F28D 21/00* (2006.01)

(56) References Cited

U.S. PATENT DOCUMENTS

| | | | |
|---|---|---|---|
| 9,686,888 B2 | 6/2017 | Song et al. | |
| 2005/0139996 A1* | 6/2005 | Myers | H01L 23/473 |
| | | | 257/784 |
| 2007/0163750 A1* | 7/2007 | Bhatti | H01L 23/473 |
| | | | 257/E23.098 |
| 2008/0210405 A1* | 9/2008 | Datta | F28D 15/0266 |
| | | | 257/E23.098 |
| 2010/0000722 A1* | 1/2010 | Muley | F28F 3/025 |
| | | | 165/151 |
| 2010/0328890 A1* | 12/2010 | Campbell | F28D 15/0266 |
| | | | 29/592.1 |
| 2012/0175094 A1* | 7/2012 | Rice | F28F 3/12 |
| | | | 165/170 |
| 2017/0092565 A1* | 3/2017 | Chen | H05K 7/20281 |
| 2019/0021188 A1* | 1/2019 | Phan | H01L 23/427 |

* cited by examiner

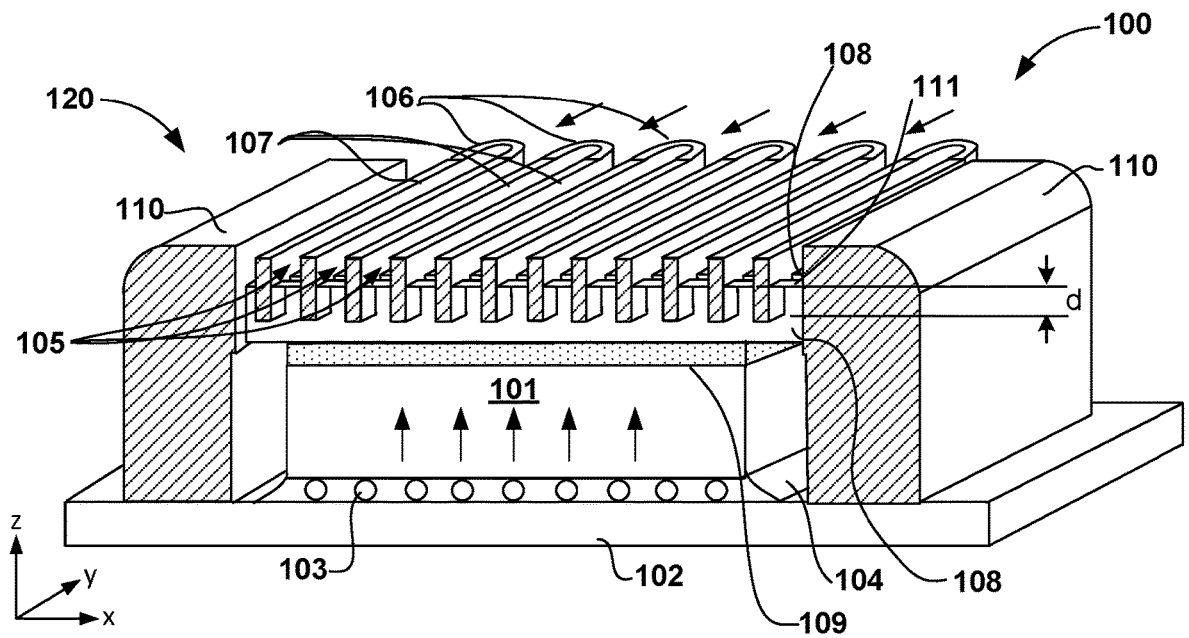
FIG. 1
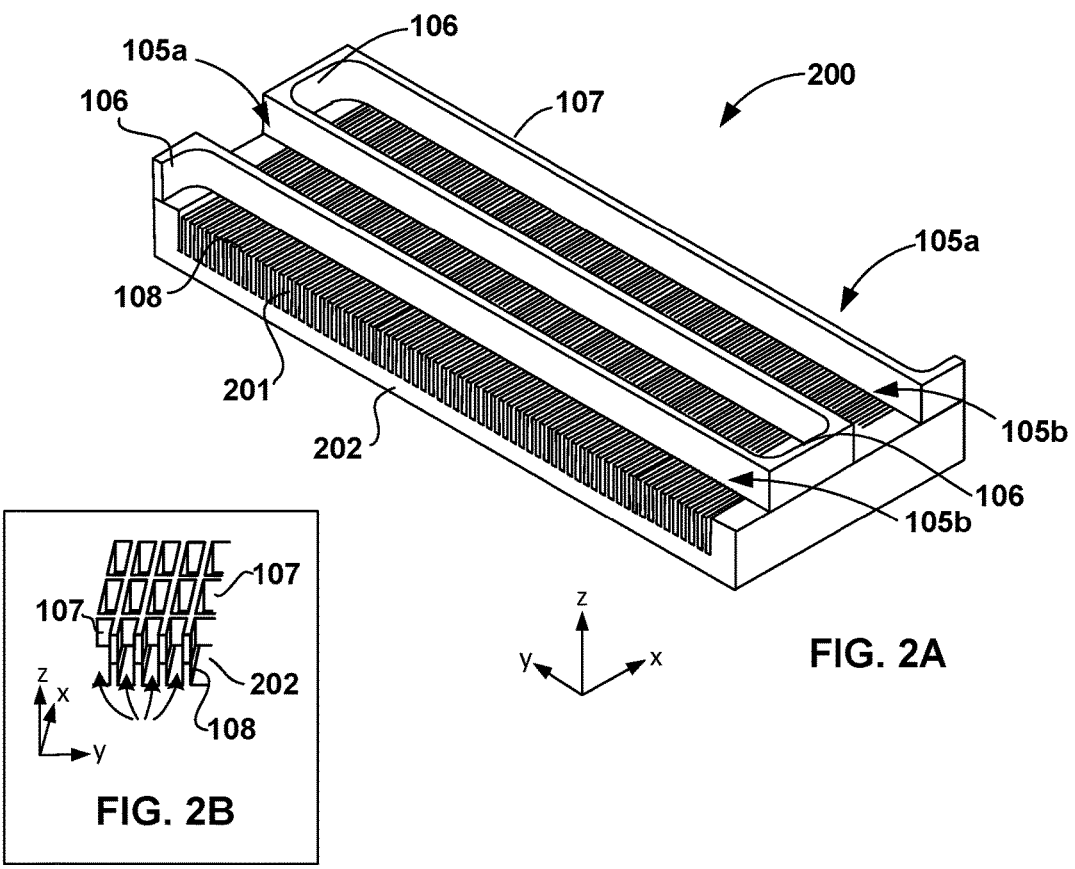
FIG. 2A
FIG. 2B

DIRECT LIQUID MICRO JET (DLMJ) STRUCTURES FOR ADDRESSING THERMAL PERFORMANCE AT LIMITED FLOW RATE CONDITIONS

BACKGROUND

Thermal management in integrated circuit (IC) packaging containing single or multiple integrated circuits (ICs) is becoming an increasingly important issue. Packaging for modern high-performance integrated circuits must contend with increasingly larger scale microelectronic circuit integration, including vertical integration of multiple integrated circuits. Smaller form factors are associated with increasingly higher power densities, having concomitant heat transfer challenges. High-performance ICs, such as modern multi-core microprocessor and high-bandwidth memory dies, commonly produce hotspots the die-substrate interconnect level by large current draw through individual signal and power interconnects. Conventionally, heat conduction through-the die itself is relied upon to remove heat from the hotspot to an integrated heat spreader and/or a thermal solution on the top of the die. In many cases, the die itself and thermal interface material offer a large amount of thermal resistance, limiting the efficacy of this heat transfer path. In multiple die packages, thermal cross-talk may occur between dies. For microprocessor package with integrated high-bandwidth memory, the thermal crosstalk may result in system power limitations. An alternative heat removal apparatus needs to be developed.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1 illustrates an oblique view of an IC package comprising a direct liquid microjet (DLMJ) modular heat exchange unit (HXU) implementation in an IC package, according to some embodiments of the disclosure.

FIG. 2A illustrates a trimetric view of a section of a DLMJ fluid distribution channel assembly of a DLMJ modular HXU to show details of fluid delivery channels, according to some embodiments of the disclosure.

FIG. 2B illustrates a trimetric view of a section of a DLMF fluid distribution channel mesh formed by intersecting channel sidewalls, according to some embodiments of the disclosure.

DETAILED DESCRIPTION

Figure 3:
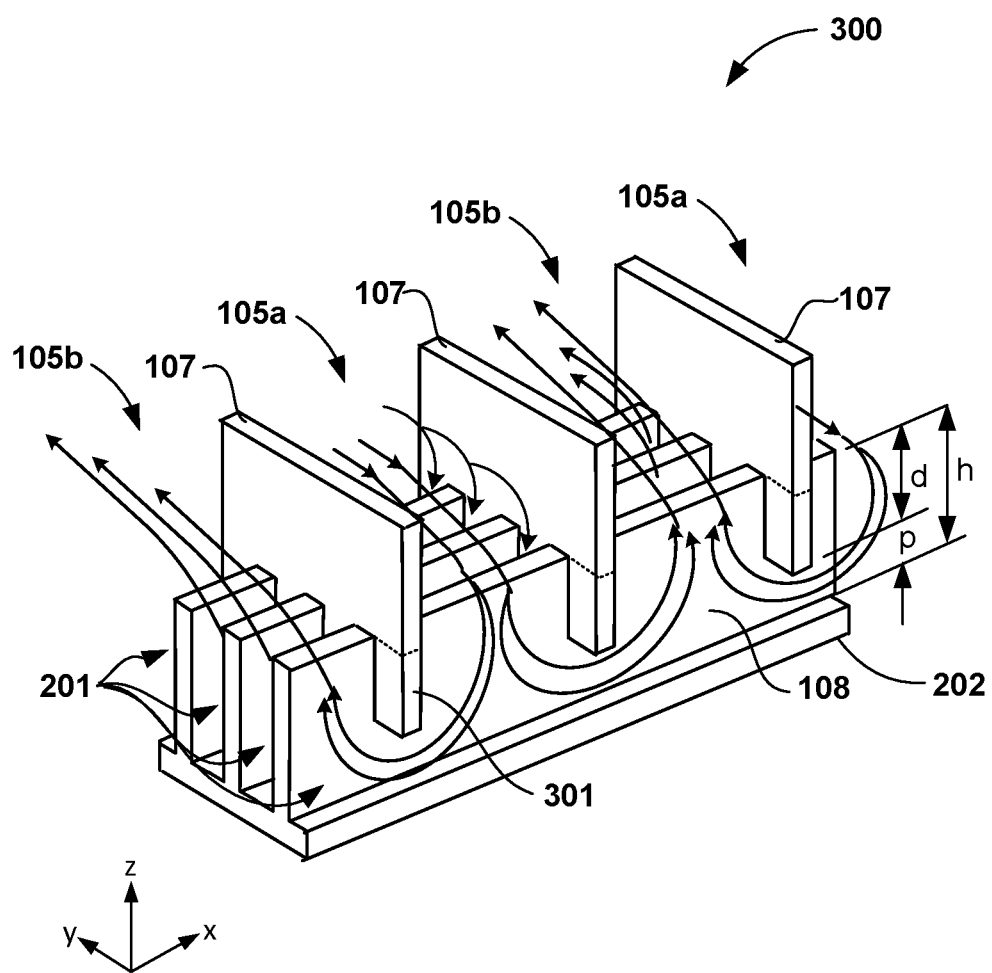
FIG. 3 illustrates a trimetric view of a section of a DLMJ modular HXU, showing details of coolant distribution from fluid distribution channels into microchannels, according to some embodiments of the disclosure.

Described herein is a package-integrated direct liquid micro jet (DLMJ) heat-exchange unit (HXU) module as a package-level thermal solution, similar to a microchannel integrated heat spreader (MC-IHS). The disclosed DLMJ HXU is a module that comprises a network of flow distribution channels in a vertical stack over a microchannel array, with which it is fluidically coupled. The microchannel array comprises a plurality of parallel microchannels extending in parallel in a first direction, where the individual microchannels are separated from one another by fin sidewalls that extend from a heat-exchange plate (e.g., a cold plate) on the bottom of the device. When assembled into an IC package, the heat-exchange plate may be placed in direct contact with one or more IC dies that are attached to the substrate of the IC package in a manner similar to mounting an integrated heat spreader. In some embodiments, a thermal interface material may be disposed between the heat-exchange surface and the IC die. In some embodiments, the heat-exchange surface, or cold plate, may cover the substantially the entire surface of the one or more IC dies.

The flow distribution channel network comprises a plurality of parallel fluid distribution channels that extend in a second direction that may be orthogonal to the first direction of the microchannels. The network may be incorporated into a stand-alone block. According to some embodiments, the parallel fluid distribution channels have a width that is larger than the width of the microchannels, and are in fluidic communication with the plurality of microchannels. According to some embodiments, the fluid distribution channels have an open interface with the microchannels such that the fluid distribution channels are fluidically coupled to the microchannels.

According to some embodiments, the network of fluid distribution channels comprises two interleaved groups of adjacent channels, where a first group of inlet channels has an inlet in communication with (e.g., opens into) a fluid source manifold and a second group of outlet channels has an outlet in communication with a fluid collection manifold. Here, the fluid is a coolant. According to some embodiments, both inlet and outlet fluid distribution channels are blind channels in that they comprise terminal ends. In some embodiments, the network of fluid distribution channels comprise an array of individual inlet channels that alternate with individual outlet channels.

According to some embodiments, the fluid distribution channels extend laterally along the distribution manifold block between the source and collection manifolds. According to some embodiments, the fluid distribution channels are stacked over the array of microchannels, where the microchannels cross underneath the fluid distribution channels. In some embodiments, fluid distribution channels and microchannels extend in orthogonal directions relative to each other. The fluid distribution channels are open to the microchannels at the interface between them, where void volumes of the fluid distribution channels and the microchannels are contiguous. Fluid is introduced and withdrawn from microchannel segments by pressure-driven flow out of a first set of fluid delivery channels (e.g., inlet channels) and returning to a second set of fluid distribution channels (e.g., outlet channels adjacent to the inlet channels). The fluid distribution channels cross over the microchannel segments and are orthogonal to the microchannels.

According to some embodiments, the source manifold distributes coolant fluid to the inlet channels) that alternate with the outlet channels, where an inlet channel is adjacent to an outlet channel. Each fluid distribution channel intersects a plurality of microchannels. Coolant flows downchannel and distributes into the intersecting microchannel segments.

Once coolant flows downward into a microchannel, the coolant follows the pressure force field and flows laterally between the inlet channel and neighboring outlet channels on either side, forming liquid microjets. To reach the outlet channels, coolant must flow along the cold plate that is adjacent to the IC dies in the package, where it convectively picks up heat transferred into the cold plate from below. As coolant transitions from inlet flow to outlet flow, the coolant is warmed. Warmed coolant flows into the outlet channels and into the collection manifold. The collected warm coolant may then flow into tubing or other such plumbing coupled to the collection manifold, and encounter a heat exchange device to dissipate the collected heat from the IC package.

By employing fluid distribution channels that have a larger cross-sectional area than the microchannels, coolant may flow with low pressure drop down the fluid distribution channels so that the supply of coolant to the intersecting microchannels below is constant. The flow within the microchannels forms multiple liquid microjets along each microchannel.

Due to the uniformity of delivery pressure, microjets formed at the end of the inlet channel are substantially the same as microjets formed at the entrance to the inlet channel. As the network of inlet channels extends in two dimensions, an array of microjets is distributed over the IC dies under the cold plate of the DLMJ HXU. The flow distance of the microjets is uniform, and may be less than one millimeter. A uniformity of heat transfer conditions over the entire surface of any dies covered by the DLMJ HXU is afforded by the microjet array. Heat transfer performance is increased.

An aspect of the disclosure is to provide vertically-oriented baffles within the microchannels to direct flow of coolant close to the cold plate. Baffles extend a distance into the microchannels, forming apertures that have smaller hydraulic diameters than that of the microchannels. Coolant is forced to flow under the baffles into the apertures, where the flow velocity increases, and the total volume of coolant is caused to flow close to the cold plate, picking up a greater amount of heat. By forming a constriction within the microchannels, between the bottom of the baffle to the cold plate, the average velocity of the coolant is increased, increasing convective heat transfer by the coolant. A greater volume of coolant is forced to contact the cold plate than if the baffles were absent. A heat transfer efficiency curve may be derived as a function of baffle depth into the microchannel. By adjusting the depth of the baffle the efficiency of the disclosed DLMJ heat exchange unit may be optimized.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "microprocessor" generally refers to an integrated circuit (IC) package comprising a central processing unit (CPU) or microcontroller. The microprocessor package is referred to as a "microprocessor" in this disclosure. A microprocessor socket receives the microprocessor and couples it electrically to the PCB.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

FIG. 1 illustrates a sectional oblique view of an IC package 100 implementation comprising a direct liquid micro jet (DLMJ) modular heat exchange unit (HXU) 110, according to some embodiments of the disclosure.

IC package 100 comprises modular DLMJ modular heat exchange unit (HXU) 120 is shown in a packaging assembly comprising DLMJ HXU 120 over die 101. DLMJ HXU 120 and IC die 101 are mounted on substrate 102, where IC die 101 is shown bonded to substrate 102 by solder joints 103 surrounded by underfill 104, as is common in the art. In some embodiments, IC die is a microprocessor. DLMJ HXU 120 comprises a plurality of fluid delivery channels 105. Alternate fluid delivery channels 105 are shown to have closed terminations at the far end of the view (extending toward the background of the figure) by curved walls channel terminations (caps) 106 extending from and contiguous with straight sidewalls 107, which separate adjacent fluid delivery channels 105. It will be appreciated that channel terminations may be flat. It will be appreciated that in some embodiments, all of the fluid delivery channels 105 shown in FIG. 1 are so terminated, with terminations alternating between foreground and background. The view is truncated for clarity, where the hatched surfaces indicate where DLMJ HXU 120 is cut by an x-z plane. Not shown in the sectional view are similar terminations for alternate fluid delivery channels 105, but extending into the foreground of the figure. In some embodiments, DLMJ HXU 120 may extend in the y direction out of the plane of the figure to cover multiple IC dies the same as or similar to IC die 101. The continuity of straight sidewalls 107 with caps 106 form a contiguous serpentine sidewall structure, according to the illustrated embodiment. In alternate embodiments, the channel terminations may be flat, where the contours of the contiguous serpentine sidewall structure are substantially rectilinear. Not shown is a distribution or collection manifold (generically "manifold") that may be a chamber extending in front of and behind DLMJ HXU 120, extending into the foreground and background of the figure (along the y-axis). The distribution and collection manifolds are described below.

Sidewalls 107 and caps 106 need not be good thermal conductors as they do not provide heat transfer surfaces. In some embodiments, sidewalls 107 and caps 106 comprise metallic or non-metallic materials. Suitable materials include, but are not limited to, copper, steel, nickel, aluminum or tungsten. In some embodiments, sidewalls 107 and caps 106 comprise non-metallic materials such as thermoplastics such as polyethylene or polypropylene, thermosetting plastics such as acrylonitrile butadiene styrene (ABS), polystyrenes, acrylics, polyethylene terephthalate (PET), ceramics or ceramic composites.

Caps 106 prevent any fluid contained within the fluid distribution channel 105 from flowing into an opposing manifold. As an example, arrows in the background of FIG. 1 may point into the inlets of a plurality of inlet channels that extend from a distribution manifold. The inlet channels may be a first subset of fluid distribution channels 105. Adjacent to each inlet channel is an outlet channel, the plurality of which may be a second subset of fluid distribution channels 105. Outlet channels carry warmed fluid to a collection manifold (described below). Caps 106 at the ends of inlet channels prevent fresh coolant from flowing into the collection manifold. Conversely, caps 106 at the ends of the outlet channels prevent warmed coolant from flowing into the distribution manifold that contains fresh coolant. According to some embodiments, the plurality of inlet channels is interleaved with the plurality of outlet channels.

Referring to FIG. 1, DLMJ HXU 120 further comprises microchannel fins 108 in a plane below (in the z-direction) the fluid delivery channels 105, of which one microchannel fin 108 extending in the x-direction of the figure and orthogonally to fluid delivery channels 105 is shown in the foreground of the view. It is understood that a plurality of microchannel fins 108 extend in the y-direction behind the visible microchannel fin 108, and are shown more clearly in FIGS. 2A and 2B. Between microchannel fins 108 are microchannels (not shown in FIG. 1, but shown in FIGS. 2A and 2B). Microchannel fins 108 are intersected by fluid delivery channel sidewalls 107, where sidewalls 107 extend a distance d below the tops of microchannel fins 108. In the illustrated embodiment, microchannel fins are orthogonal to sidewalls 107. In some embodiments, microchannel fins 108 intersect sidewalls 107 of fluid distribution channels 105 at non-orthogonal angles.

In some embodiments, microchannel fins 108 comprise metallic or non-metallic materials. Suitable materials include, but are not limited to, copper, steel, nickel, aluminum or tungsten. In some embodiments, microchannel fins 108 comprise non-metallic materials such as thermoplastics such as polyethylene or polypropylene, thermosetting plastics such as acrylonitrile butadiene styrene (ABS), polystyrenes, acrylics, polyethylene terephthalate (PET), ceramics or ceramic composites.

In some embodiments, microchannel fins 108 and microchannels are disposed within a microchannel block (described below) that is separate structure from a fluid delivery block (described below), which comprises fluid delivery channels 105. In some embodiments, microchannel fins 108 extend from a cold plate (not shown in FIG. 1; described below) that is in contact with IC die 101 for heat exchange. In some embodiments, a thermal interface material (TIM) 109 is disposed between IC die 101 and DLMJ HXU 120.

In the illustrated embodiment, microchannel fins 108 and fluid distribution channels 105 are supported by chassis 110. In some embodiments, fluid distribution channels and microchannel fins 108 may be integral with chassis 110, where microchannel fins and chassis 110 are formed from a single piece. In some embodiments, microchannel fins 108 are carried in a separately fabricated microchannel block that seats in chassis 110. In some embodiments, a fluid delivery block may be stacked over a microchannel block seated within chassis 110. Chassis 110 comprise a suitable metal that includes, but is not limited to, copper and copper alloys such as brass, nickel, steel alloys such as stainless steel alloys or aluminum and alloys of aluminum. In some embodiments, chassis 110 is attached to substrate 102.

Fluid distribution channels 105 may be integral with microchannel fins 108, according with some embodiments. Fluid distribution channels 105 may be integrated into a separate component that interlocks with microchannel fins 108 or a microchannel block (shown below). Sidewalls 107 may extend a distance d below microchannel fin tops 111 to provide baffles in the microchannels between microchannel fins 108 for more favorable coolant flow diversion as explained above. In some embodiments, DLMJ HXU 120 is an assembly of separate components, such as the fluid distribution channel block (described below), a microchannel block (described below) and chassis 110.

Accordingly, microchannel fins 108 may be notched or grooved to receive extended sidewalls 107, as shown in the illustrated embodiment of FIG. 1. A microchannel block comprising notched microchannel fins 108 may be seated in chassis 110, and a fluid distribution block fit over the microchannel block by insertion and press fit of extended sidewalls 107 into the notches. In some embodiments, notches or grooves may be machined or otherwise formed (e.g., by 3-D printing) along microchannel fins 108, and detached baffles may be inserted as bars into the notches or grooves (described below). A fluid distribution block may be assembled in such a way that sidewalls 107 are aligned with the baffles.

Upward-pointing arrows indicate heat flow through IC die 101 from hotspots or distributed heat generation in the active layer of the die at the interface between substrate 102 and IC die 101. Heat may flow to the back side of IC die 101, through TIM 109 and though the cold plate (not shown).

FIG. 2A illustrates a trimetric view of a section of the DLMJ fluid distribution channel assembly 200 of DLMJ HXU 120 to show details of the fluid delivery channels 105, according to some embodiments of the disclosure.

FIG. 2A shows a complete view 200 of two adjacent fluid distribution channels 105 and a section of microchannels 201 below fluid distribution channels 105. In some embodiments, microchannels have a width of 1 mm or less. In some embodiments, fluid distribution channels have a width of 5 mm or less. In some embodiments, microchannels 201 have heights (in the z-direction) of 20 mm or less. In some embodiments, sidewalls 107 have heights of 1 mm or less. Fluid distribution channels 105 may have a width that is five to 100 times the width of microchannels 201. Fluid distribution channels 105a and 105b reference inlet and outlet channels, respectively, and are collectively referenced as 105. The choice of a particular channel as an inlet channel or an outlet channel is for illustrative purposes only, and not limiting. Fluid distribution channels 105 extend across the array of microchannels 201 in a direction that is substantially orthogonal to the orientation of the microchannels 201, according to some embodiments. Microchannels 201 are separated from one another by microchannel fins 108. In some embodiments, microchannel fins 108 extend from cold plate 202 that forms the bottom of microchannels 201, and provides the heat transfer interface for DLMJ HXU 120. In implementations as shown in FIG. 1, cold plate 202 is to interface with one or more IC dies (e.g., IC die 101 in FIG. 1). In some embodiments, cold plate 202 comprises materials with high thermal conductivity, such as, but not limited to, copper, stainless steel, nickel or aluminum.

Adjacent fluid distribution channels are inlet channel and outlet channel pairs, referenced as 105a and 105b, respectively. Inlet channels 105a and outlet channels 105b extend from opposite sides of the microchannel array. A shared sidewall 107 is between inlet channel 105a and outlet channel 105b. As shown above in FIG. 1, fluid distribution channels 104 comprise inlet or outlet mouths at a first end and are terminated with caps 106 at a second end, forming blind channels. In some embodiments, sidewalls 107 and caps 106 are contiguous structures, forming a continuous serpentine sidewall that is shared between each pair of inlet and outlet channels 105a and 105b, respectively. The orientation of the mouths and terminations alternate between opposite sides, so that adjacent fluid delivery channels 105a and 105b alternate.

FIG. 2B shows a mesh formed by intersecting fluid distribution channel sidewalls 107 extending in the y-direction and microchannel fins 108 extending in the x-direction. Fluid distribution channels 105 extend along the y-axis between sidewalls 107 and above microchannels 201, thus are not shown in the inset. Sidewalls 107 extend downward along the z-axis into microchannels 201, forming baffles as described below. The space between the bottoms of the baffles and the cold plate 202 at the bottom of the microchannels 201 is a flow constriction aperture, described below.

FIG. 3 illustrates a trimetric view of section 300 of DLMJ modular HXU 120, showing details of coolant distribution from fluid distribution channels 105 into microchannels 301, according to some embodiments of the disclosure.

Microchannels 201 extend along the x-direction of the figure between microchannel fins 108, crossing under fluid distribution channels 105, further distinguished as inlet channel 105a and outlet channel 105b. Fluid distribution channels, collectively referenced as fluid distribution channels 105, extend along the y-direction of the figure and are substantially orthogonal to microchannels 201 in the illustrated embodiment. In some embodiments, microchannels 201 extend in non-orthogonal directions relative to fluid distribution channels 105. As described above, sidewalls 107 may extend a distance d below the tops of microchannel fins 108 to provide diversionary baffles 301 within microchannels 201 to concentrate coolant flow streamlines close to cold plate 202. Cold plate 202 is disposed at the base of microchannels 201 and contains coolant within. Cold plate 202 may transfer heat by conduction into DLJM HXU 120 and provide a heat transfer surface by which heat is convectively transferred to the flowing coolant. In some embodiments, baffles 301 are extensions of sidewalls 107. In alternate embodiments, baffles 301 are separate components, such as cross fins intersecting microchannel fins 108, that may be assembled separately from fluid distribution channels 105, as indicated by the dashed lines extending from the top of microchannel fins 108.

An exemplary coolant flow distribution pattern between fluid distribution channels 105 and microchannels 201 is indicated by the contoured arrows in FIG. 3. Coolant flowing down inlet channels 105a flows downward (negative z-direction) into sections of microchannels 201 that cross below. Starting with fresh coolant flowing from the inlet channels into the microchannels, once fresh coolant enters the microchannels crossing under the inlet channel it flows in two-dimensional pattern, both downward (e.g., in a z-direction, where the vertical axis is the z-axis) and laterally (e.g., in a x or y direction, where the x-y plane is orthogonal to the z-axis). Assuming laminar flow, streamlines of fresh coolant flowing downward into the microchannels fan out laterally as microjets. A distribution of lateral fluid velocity of coolant may be established from the top to bottom of the microchannels, where portions of coolant at the top of the microchannel furthest away from the cold plate flows more quickly (e.g., higher velocity) than portions of coolant at the bottom of the microchannel, closest to the cold plate. Portions of coolant at the top of the microchannel may flow directly into adjacent outlet channels without contacting the cold plate.

Coolant flowing further into the depths of the microchannels may have progressively greater degrees of contact with the cold plate, picking up greater amounts of heat. However, these fluid segments may flow progressively more slowly as depth within the microchannel increases. Convective heat transfer reduces as fluid velocity slows.

By extending downward in microchannels 201, baffles 301 force streamlines crossing underneath to flow close to cold plate 202, thus focusing the microjets and increasing their efficacy. By providing a constriction aperture having a partial height p of the total microchannel height h, coolant microjet velocity is increased as a function of height p, where p is optimized to provide a suitable coolant microjet velocity with minimal pressure drop. Heat transfer performance of DLMJ HXU 120 (FIG. 1) may be maximized by optimization of aperture height p.

The arrows indicate coolant flowing substantially laterally through the constriction aperture of height p into adjacent microchannel sections on either side of inlet channel 105*a*, crossing under outlet channels 105*b*. Fluid elements flowing through the constriction aperture under baffles 301 carry heat away from cold plate 202 by convection. Warmed coolant flows upward by both forced and natural convection, and enters outlet channels 105*b*, with fluid elements emerging from downstream sections of microchannels 201 along outlet channels 105*b* to form a bulk flow of warmed coolant along the length of outlet channels 105*b*. A positive pressure differential between inlet and outlet channels 105*a* and 105*b*, respectively, may drive the forced convection of the coolant.

Figure 4A:
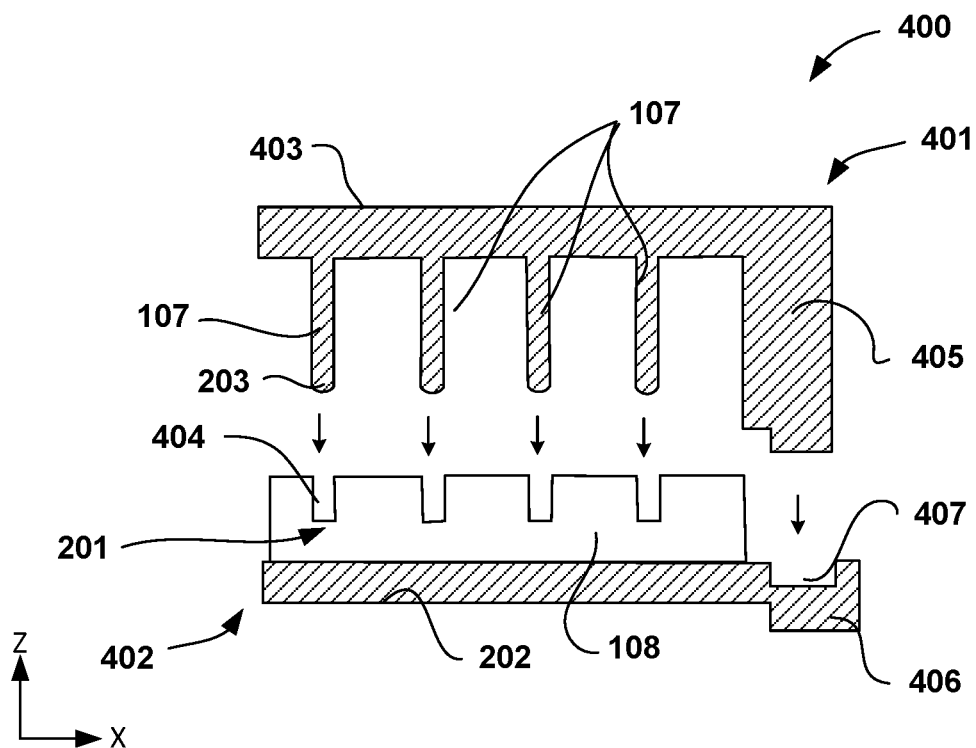
FIG. 4A illustrates a cross-sectional view of a fluid delivery block and a microchannel block as separate components in a pre-assembly state, according to some embodiments of the disclosure.

FIG. 4A illustrates a cross-sectional view of fluid delivery block 401 and microchannel block 402 as separate components in a pre-assembly state, according to some embodiments of the disclosure.

An embodiment 400 of DLMJ assembly (refer to DLMJ assembly 200 in FIG. 2) is shown in an exploded view in FIG. 4A. DLMJ assembly 400 comprises fluid delivery block 401 and microchannel block 402. In the illustrated embodiment, sidewalls 107 extend downward from lid 403, and align with notches 404 in the upper portion of microchannel fins 108 into which sidewalls 107 insert as indicated by the downward-pointing arrows when fluid delivery block 401 is assembled with microchannel block 402. Sidewalls 107 are shown in cross-section, and it will be appreciated that sidewalls 107 extend along the y-axis above and below the x-z plane of the figure. In the illustrated embodiment, tips 203 at the bottoms of sidewalls 107 are rounded for easier insertion into notches 404 than flat tips 203.

Likewise, a single microchannel fin 108 is shown in the figure extending along the x-axis, but it will be appreciated that adjacent microchannel fins 108 are in an array extending in the y-direction below the x-z plane of the figure. Similarly, microchannels 201 between microchannel fins 108 extend along the x-axis of the figure, and continue below the plane of the figure. In the illustrated embodiment, microchannel fins 108 are substantially orthogonal to sidewalls 107. However, in some embodiments, sidewalls 107 cut microchannel fins at a non-orthogonal angle.

In some embodiments, fluid delivery block 401 comprises wall 405 that seats on cold plate 202. In the illustrated embodiment, rim 406 of cold plate 202 comprise groove 407 into which wall 405 inserts. A hermetic seal may be formed by brazing wall 405 to rim 406. Similarly, sidewalls 107 may be brazed to microchannel fins 108 to form a fluid-tight seal. Alternatively, various organic or inorganic sealing compounds and adhesives may be employed to seal flow fluid delivery block 401 to microchannel block 402.

Figure 4B:
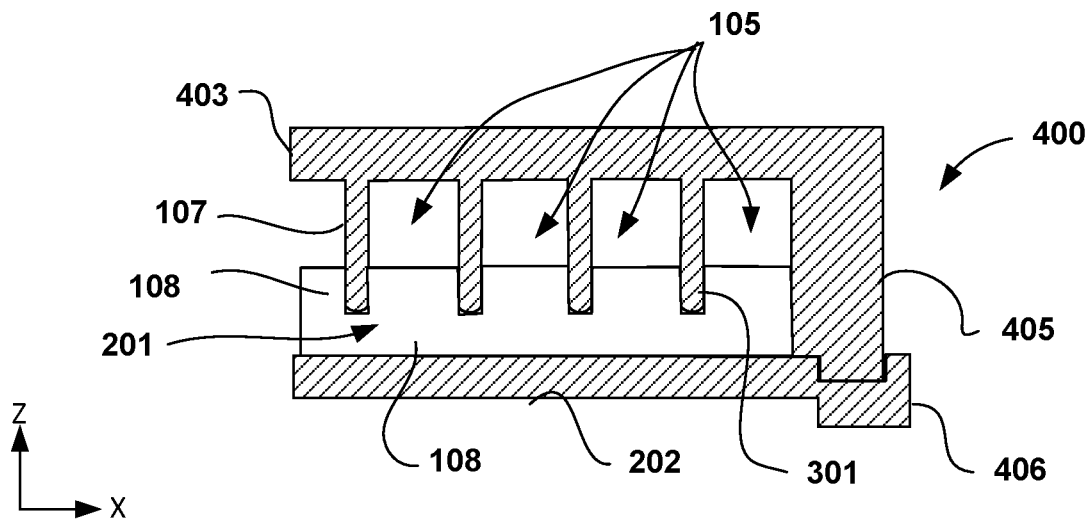
FIG. 4B illustrates a cross-sectional view in the x-z plane of a DLMJ assembly as assembled according to some embodiments of the disclosure.

FIG. 4B illustrates a cross-sectional view in the x-z plane of DLMJ assembly 400 as assembled according to some embodiments of the disclosure.

In the assembled view, DLMJ assembly 400 comprises fluid delivery block 401 sealed to microchannel block 402, wherein a suitable coolant may be circulated. Fluid delivery block 401 may comprise distribution and collection manifolds (not shown) that are disposed at the ends of fluid distribution channels 105 above and below the plane of the figure, to which the manifolds are fluidically coupled. In some embodiments, DLMJ assembly 400 seats in a support structure, such as chassis 110 (shown in FIG. 1) that is disposed over one or more IC dies (e.g., IC die 101) and attached to a package substrate (e.g., substrate 102). The chassis may provide structural support to DLMJ assembly 400. In some embodiments, DLMJ assembly 400 is a stand-alone unit that is assembled as a heat transfer lid over one or more IC dies, without further structural support.

DLMJ assembly 400 may be coupled to a coolant pumping system through fluid interconnects (not shown) extending from distribution and collection manifolds (see below). Narrow diameter copper, aluminum or steel tubing may be employed to transfer coolant fluid from a remote reservoir to DLMJ assembly 400. Transfer tubing may comprise a polymeric material. A suitable pump may be employed in the fluid circuit to generate sufficient flow rate at specified pressures. Suitable fluid materials to be used as a coolant comprise or are entirely liquids such as water, alcohols such as methanol or isopropanol or ethylene glycol; gases such as air, nitrogen, helium or argon. The fluid circuit may comprise an external heat sink engineered to dissipate the heat of the warmed coolant collected from the package and reduce the temperature of the coolant to substantially an initial temperature.

Fluid distribution channels 105 are formed between sidewalls 107 upon attachment of fluid delivery block 401 to microchannel block 402, confined within fluid delivery block 401 by lid 403 and walls 405. It will be appreciated that fluid distribution channels 105 extend above and below the plane of the figure along the y-axis, and are substantially orthogonal to microchannels 201, according to some embodiments. In some embodiments, sidewalls 107 extend into microchannels 201, cutting across microchannel fins 108 and providing baffles 301. The proximity of baffles 301 to cold plate 202 may be optimized for maximal heat transfer performance, as mentioned above. The cross sectional dimensions of each fluid distribution channel 105 may be optimized to minimize pressure drop while having a large enough hydraulic diameter to ensure an adequate flow rate.

Figure 4C:
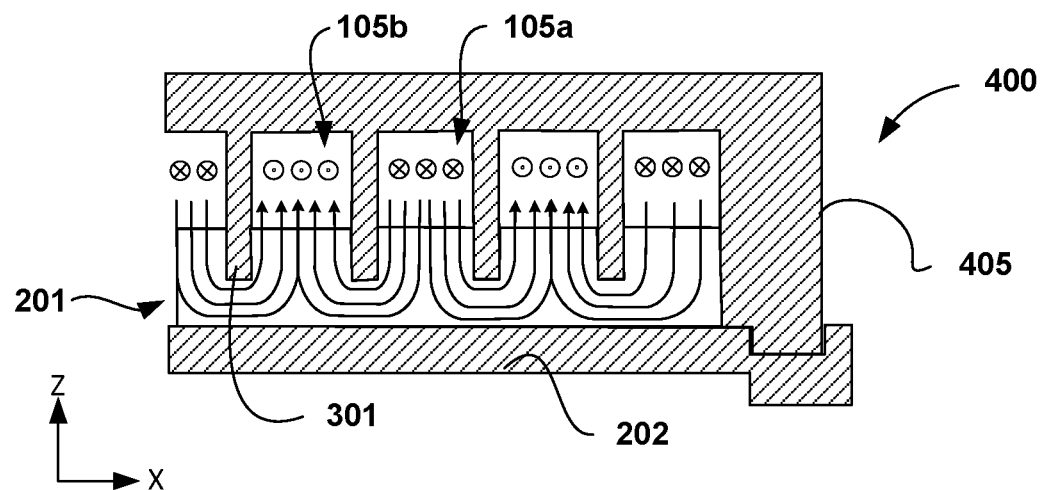
FIG. 4C illustrates an exemplary coolant flow pattern within a DLMJ assembly in cross-section, according to some embodiments of the disclosure.

FIG. 4C illustrates an exemplary coolant flow pattern within DLMJ assembly 400 in cross-section, according to some embodiments of the disclosure.

Inlet and outlet flow within flow distribution channels 105 is indicated by arrows viewed end-on within the channels. Circumscribed dots indicate outlet flow within the flow distribution channels 105*b* toward the viewer, and circumscribed crosses indicate inlet flow within flow distribution channels 105*a* away from the viewer. The curved arrows indicate lateral microjet flow within microchannels 201. The flow pattern may repeat itself in each microchannel 201.

Inlet flow moving away from the viewer in channels 105*a* distributes coolant in each microchannel segment that crosses below them. As explained above, the coolant enters microchannels 201 from a distribution manifold (not shown) upstream, and is directed to flow below baffles 301 as a microjet. Concentration of streamlines along the surface of cold plate 202 indicates the most of volume of flow is in the vicinity of cold plate 202, and at a fluid velocity that enables a large convective heat transfer coefficient. Warmed coolant flowing below outlet channels 105*b* rises into these channels and flows toward a collection manifold (not shown) downstream (below the plane of the figure).

Figure 4D:
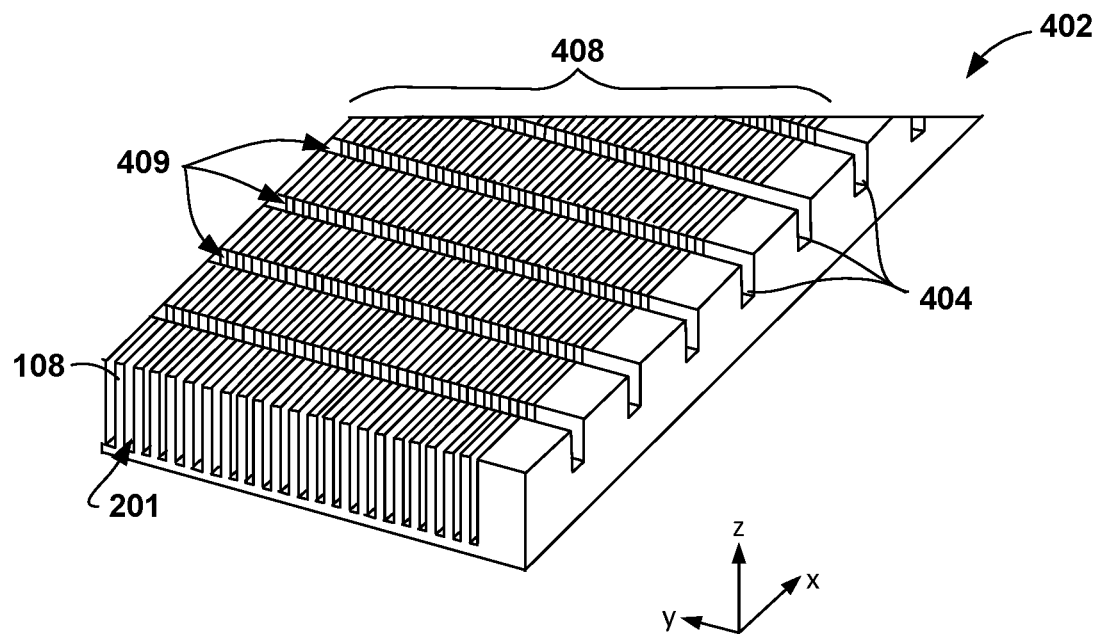
FIG. 4D illustrates a trimetric top view of a portion of a microchannel block, according to some embodiments of the disclosure.

FIG. 4D illustrates a trimetric top view of a portion of microchannel block 402, according to some embodiments of the disclosure.

A three-dimensional view of microchannel block 402 is shown to illustrate structural details of the ensemble of microchannel fins 108 and microchannels 201. An array of microchannels 408 comprises a plurality of microchannels 201, each microchannel 201 disposed between adjacent microchannel fins 108. A series of notches 404 that are in formed in individual microchannel fins 108 align in the microchannel array 408 to form slots 408. In some embodiments, grooves 408 are formed by skiving microchannel block 402 after formation of microchannels 201, and not by forming notches 404 in individual microchannel fins 108. Fabrication methods of microchannels 201 and embodiments of microchannel block 402 are described below.

In some embodiments, extended sidewalls 107 from a fluid distribution block (e.g., fluid distribution block 401) are press-fit into grooves 409 during the build of DLMJ assembly 400. The portion of sidewalls 107 extending into grooves 409 provide baffles (e.g., baffles 301) within microchannels 201. In some embodiments, baffles 301 are extensions of sidewalls 108.

Figure 5A:
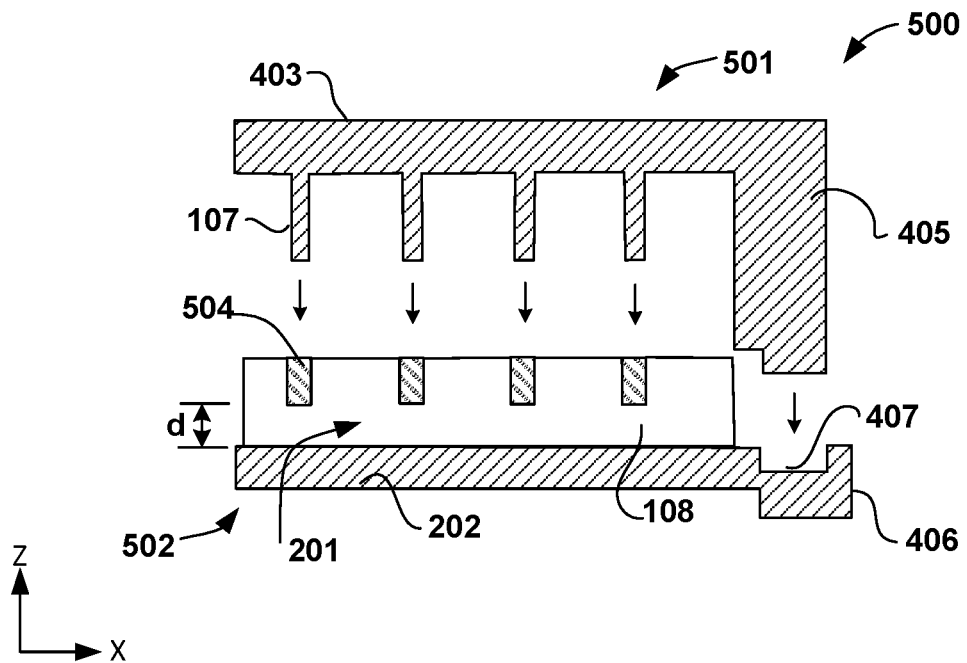
FIG. 5A illustrates a cross-sectional view of a DLMJ assembly in a pre-assembly state, comprising a fluid delivery block and a microchannel block as separate components, according to some embodiments of the disclosure.

FIG. 5A illustrates a cross-sectional view of DLMJ assembly 500 in a pre-assembly state, comprising fluid delivery block 501 and microchannel block 502 as separate components, according to some embodiments of the disclosure.

Fluid delivery block 501 comprises sidewalls 503 extending downward (in the z-direction of the figure) from lid 403, which have a shorter length than sidewalls 107 in FIGS. 4A-4C, enabling sidewalls to rest on the top of microchannel fins 108 and not insert into notches (e.g., notches 404) when wall 405 is seated on rim 406 of microchannel block 502. Fluid distribution channel block 501 and microchannel block 502 may comprise the same materials fluid delivery block 401 and microchannel block 402. In some embodiments, sidewalls 503 align with separate baffles 504 that are integrated in microchannel fins 108. Baffles 504 are integrated into microchannel block 502 and are separate structures from sidewalls 503 in fluid distribution block 501. Baffles 504 may be formed by insertion of bars into notches (e.g., notches 404) that are pre-formed in microchannel fins 108, and sealed by brazing. In some embodiments, baffles 504 are formed by 3-D printing. Methods of fabrication of microchannel block 502 are described below. Baffles 504 comprise materials such as, but not limited to, copper, stainless steel, nickel, aluminum or tungsten.

Baffles 504 extend along the y-axis of the figure below the x-z plane of the figure. may extend in the z-direction a distance d below the tops of microchannel fins 108 into microchannels 201, forming a flow aperture between the bottoms of baffles 504 and the surface of cold plate 202. As described above, distance d may be adjusted to optimize the hydraulic diameter of the flow aperture below baffles 504.

Figure 5B:
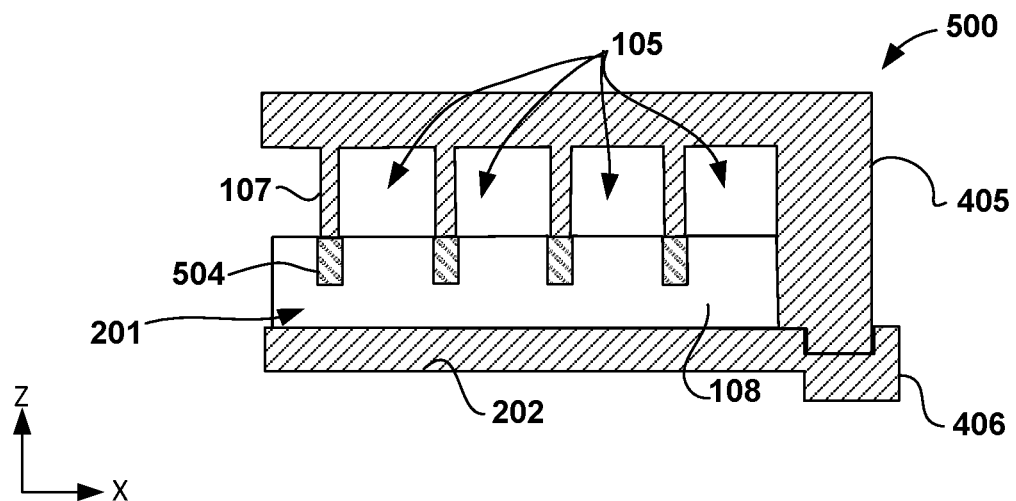
FIG. 5B illustrates a cross-sectional view of a DLMJ assembly in an assembled state, according to some embodiments of the disclosure.

FIG. 5B illustrates a cross-sectional view of DLMJ assembly 500 in an assembled state, according to some embodiments of the disclosure.

In the illustrated embodiment, DLMJ assembly 500 comprises fluid delivery block 501 and microchannel block 502 joined and bonded together. Bond joints may be between sidewalls 107 and baffles 504, and wall 405 and rim 406. In some embodiments, fluid distribution block 501 and microchannel block 502 are joined by brazing joints. In some embodiments, organic and inorganic sealing compounds and adhesives are employed. Baffles 504 have a width that may be adjusted to match the width of sidewalls 107. Widths of sidewalls 107 may be in measure with the number and flow distribution channels 105 and overall dimensions of DLMJ assembly 500.

Figure 5C:
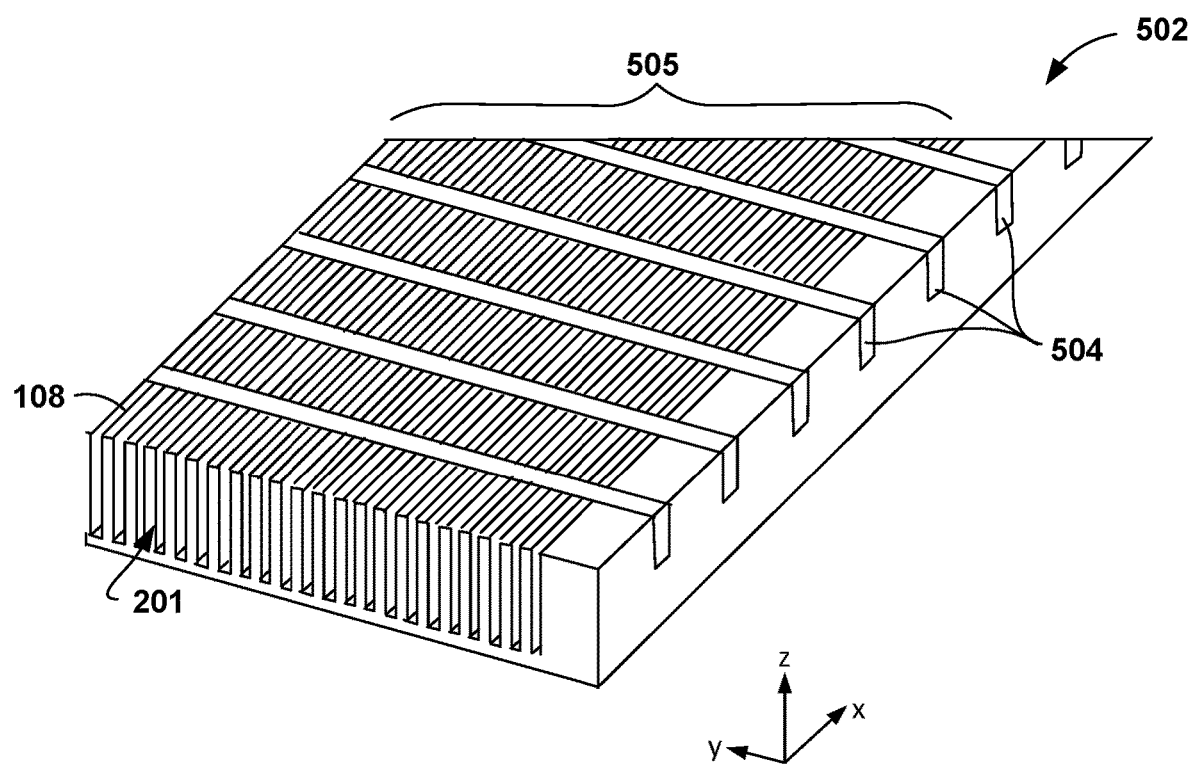
FIG. 5C illustrates a top trimetric view of a portion of a microchannel block, according to some embodiments of the disclosure.

FIG. 5C illustrates a top trimetric view of a portion of microchannel block 502, according to some embodiments of the disclosure.

A three-dimensional view of microchannel block 502 is shown to illustrate structural details of the ensemble of microchannel fins 108, microchannels 201 and baffles 504. Grooves (not shown; similar to grooves 409 in microchannel array 408, shown in FIG. 4D) may be formed by skiving microchannel block 502 after formation of microchannels 201 and inserting baffles 504. In some embodiments, microchannels 201 and baffles 504 are integrally formed, e.g., by laser cutting channel sections in a solid metal block. In some embodiments, microchannel block 502 with integral baffles 504 is built in a 3-D printing process. Fabrication methods of microchannels 201 and embodiments of microchannel block 402 are described below.

Figure 6A:
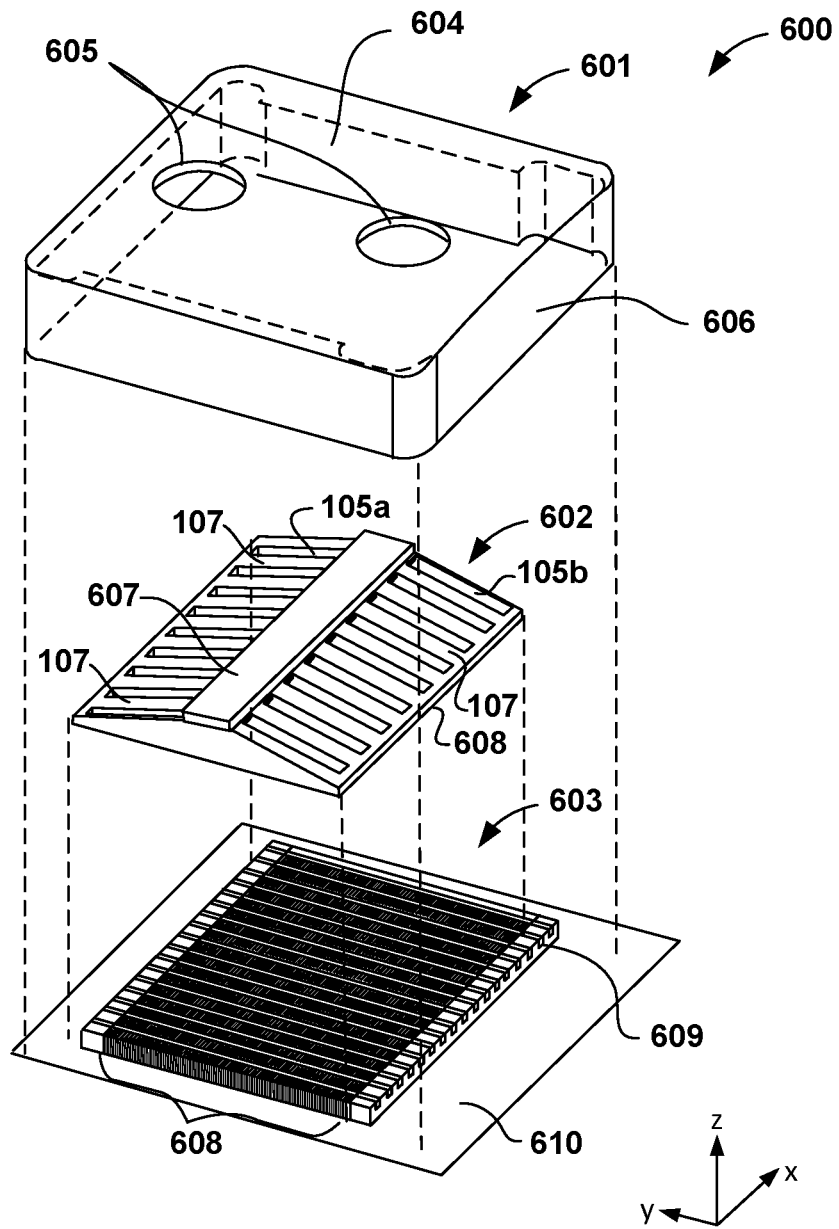
FIG. 6A illustrates an exploded trimetric view of a DLMJ module, according to some embodiments of the disclosure.

FIG. 6A illustrates an exploded trimetric view of DLMJ module 600, according to some embodiments of the disclosure.

DLMJ module 600 is a three-piece unit, comprising cover 601, fluid delivery block 602 and microchannel block 603. Cover 601 comprises lid 604 and at least two fluid ports 605 disposed in lid 604. Walls 606 extend orthogonally from the edges of lid 604. In some embodiments, walls 606 have a z-height of 10 mm or less. In some embodiments, fluid ports 605 are disposed in walls 606. In some embodiments, fluid ports 605 are disposed in adjacent halves of lid 604. Cover 601 comprises materials including, but not limited to, copper, steel, nickel, aluminum, a ceramic or an organic polymeric material. In some embodiments, cover 601 comprises a transparent thermoset plastic. Fluid ports 605 may be threaded or non-threaded openings in cover 601 to accept a fitting to couple DLMJ assembly 600 in a fluid circuit. In some embodiments, fluid ports 605 have an integrated fitting.

Fluid delivery block 602 comprises fluid delivery channels 105 comprising inlet channels 105a and outlet channels 105b disposed on opposite sides of central member 607, which is positioned substantially midway between edges 608 of fluid delivery block 602. In some embodiments, inlet channels 105a are structurally identical to outlet channels 105b in regards to dimensions and shape. In some embodiments, inlet channels 105a and outlet channels 105b are mirror images. In the illustrated embodiment, sidewalls 107 separate fluid delivery channels 105 and increase in height toward the center of fluid delivery block 602. The sloped feature of sidewalls 107 lends a trapezoidal profile to fluid delivery block 602 (see FIG. 6C). It will be appreciated that the particular slope of sidewalls 107 is not limiting. A flat profile of sidewalls 107 is shown in FIGS. 7A and 7B. Fluid delivery channels 105 extend between edges 608 and the central member 607.

Similar to cover 601, fluid delivery block 602 comprises metallic and polymeric materials. As mentioned above, fluid delivery block may comprise thermally insulating (e.g., low thermal conductivity materials) materials such as ceramics, thermoplastic or thermosetting polymers. Fluid delivery block 602 has a z-height ranging between 1 mm and 10 mm.

Microchannel block 603 comprises microchannel array 608 and integrated baffles 609 similar to integrated baffles 504 (FIGS. 5A-5C). Microchannel array 608 is disposed over base 610. In the illustrated embodiment, base 610 comprises a heat exchange surface such as cold plate 202 that may be limited to the central portion of base 610 directly under microchannels 201, and has a greater lateral extent than microchannel array 608, but it will be appreciated that the size of base 610 is not a limiting feature as will be shown below. Base 610 may comprise non-conducting (thermal) portions around its perimeter that are structural supports. In some embodiments, microchannel block 603 has a z-height ranging between 1 and 10 mm., and may have lateral dimensions ranging between 2 to 5 cm.

Figure 6B:
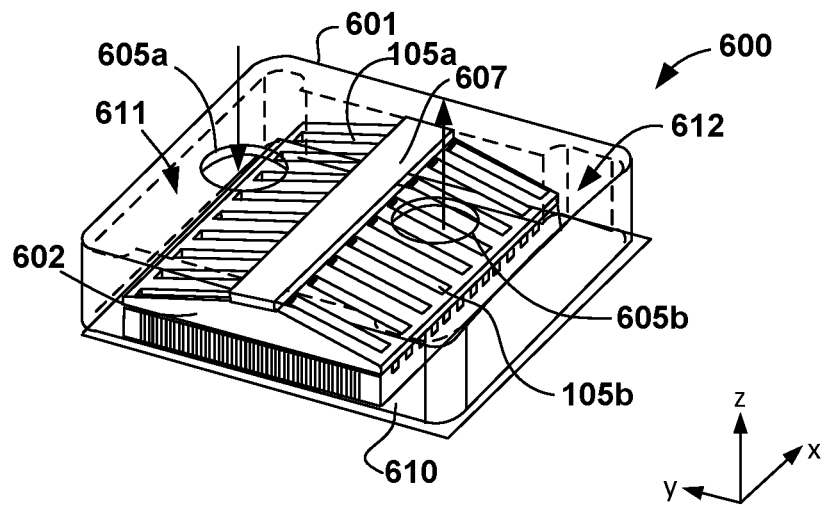
FIG. 6B illustrates a trimetric view of an assembled DLMJ module, according to some embodiments of the disclosure.

FIG. 6B illustrates a trimetric view of assembled DLMJ module 600, according to some embodiments of the disclosure.

In the illustrated embodiment, cover 601 is transparent to show parts contained within. It will be appreciated that the cover material may not be transparent, and the illustrated embodiment is not limiting. Fluid delivery block 602, microchannel block 603 and cover 601 are assembled as DLMJ module 600. In some embodiments, fluid delivery block 602 and microchannel block 603 are fit together as described above. Cover 601 central member 607 of fluid delivery block 602, forming a sealed partition between delivery manifold 611 and collection manifold 612.

By tightly fitting cover 601 over fluid delivery block 602, central member 607 may be in intimate contact with the interior surface of cover 601 (specifically, lid 604, not shown). Central member 607 seals off delivery manifold 611 and collection manifold 612. The vertical arrows pointing to and away from fluid ports 605 (e.g., 605a and 605b) show ostensible entry and exit of coolant from DLMJ module 600. As an example, fresh coolant may enter through fluid port 605a and distribute from delivery manifold 611 into the network of inlet channels 105a. Warmed coolant flows out of the network of outlet channels 105b into collection manifold 612, exiting DLMJ module 600 through fluid port 605b.

In some embodiments, DLMJ module 600 is seated in a support structure, such as chassis 110, shown in FIG. 1. In some embodiments, DLMJ module 600 seats directly over one or more IC dies (e.g., IC die 101) without a support structure.

Figure 6C:
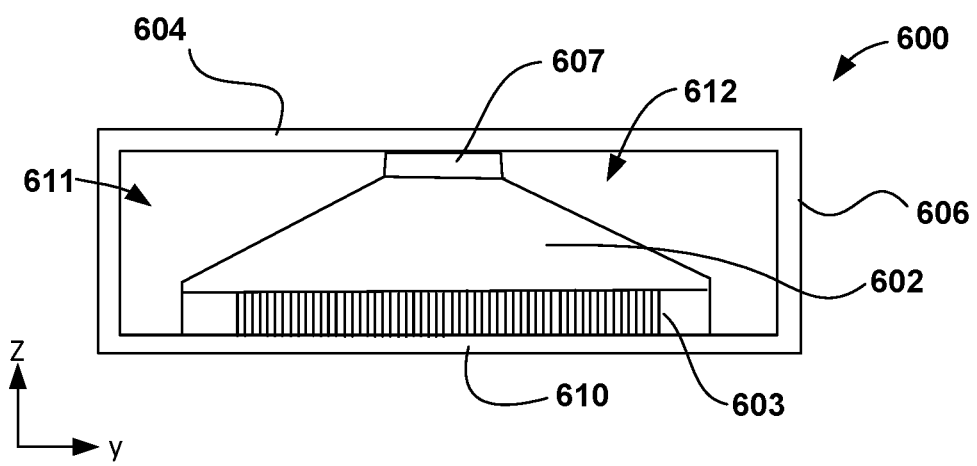
FIG. 6C illustrates a profile view in the x-z plane of a DLMJ module, showing interior details, according to some embodiments of the disclosure.
Figure 7A:
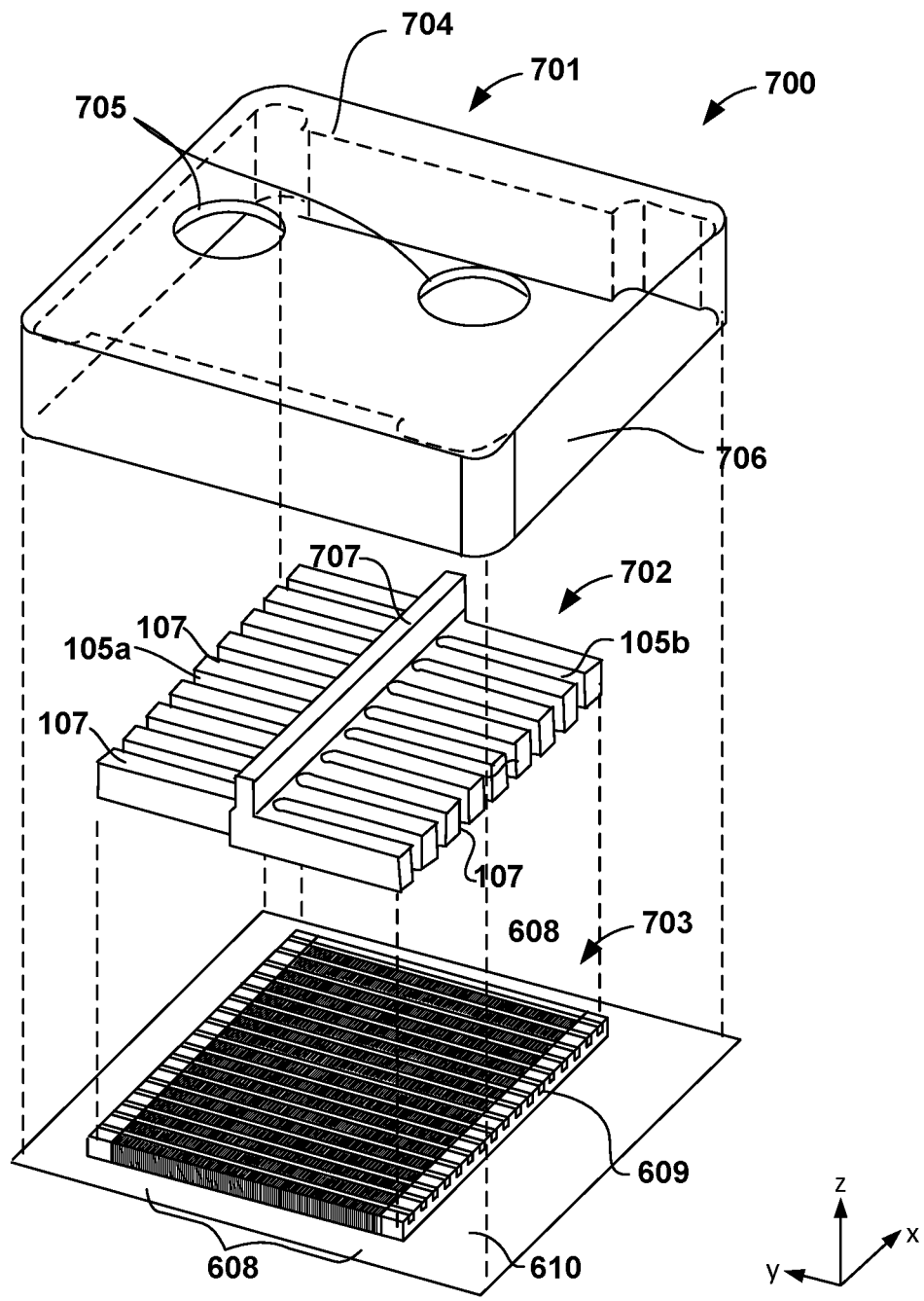
FIG. 7A illustrates an exploded trimetric view of a DLMJ module, according to some embodiments of the disclosure.
Figure 7B:
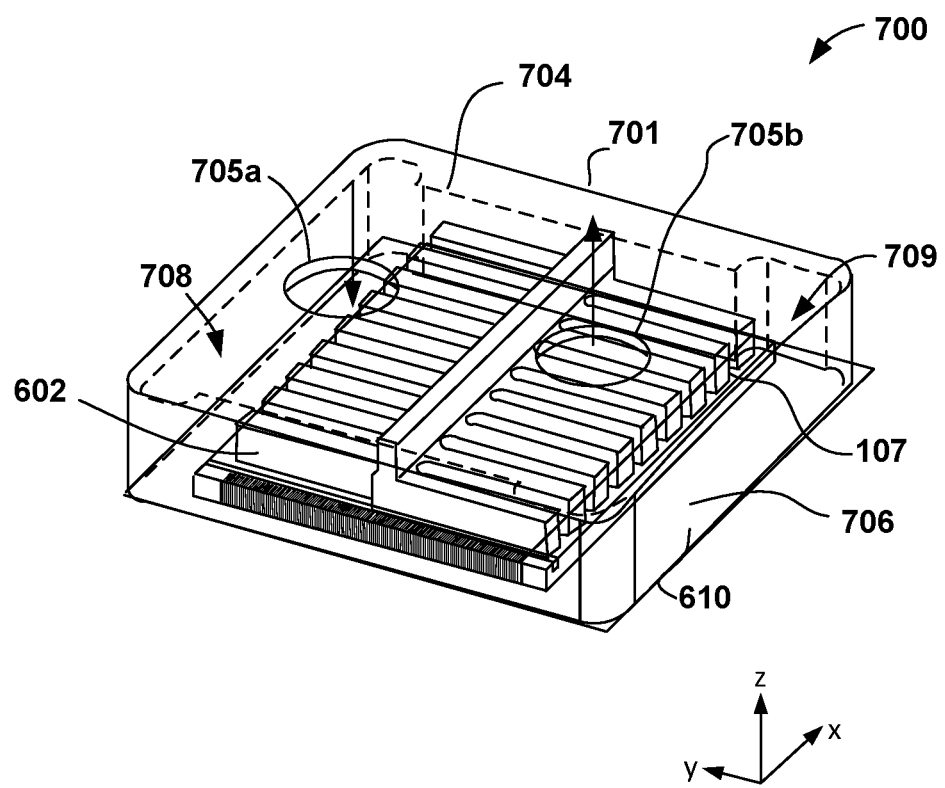
FIG. 7B illustrates a trimetric view of an assembled DLMJ module, according to some embodiments of the disclosure.

FIG. 6C illustrates a profile view in the x-z plane of DLMJ module 600, showing interior details, according to some embodiments of the disclosure.

FIG. 6C shows more clearly the separation of delivery and collection manifolds 611 and 612, respectively, by central member 607 extending above fluid delivery block 602 and abutted against the interior surface of lid 604. Fluid delivery bock 602 is positioned over microchannel 603, which may share a portion of base 110 that is a cold plate (e.g., cold plate 202). Delivery and collection manifolds 611 and 612 are enclosed by walls 606 and base 610.

FIG. 7A illustrates an exploded trimetric view of DLMJ module 700, according to some embodiments of the disclosure.

DLMJ module 700 comprises cover 701, fluid delivery block 702 and microchannel block 703. In the illustrated embodiment, cover 701 and microchannel block 703 are substantially the same as cover 601 and microchannel block 703. Fluid delivery block 702 comprises sidewalls 107 that have a flat profile. Cross member 707 is at the midpoint between inlet channels 105a and outlet channels 105b. Blind ends of inlet channels 105a and 105b are shown as having a curved contour, but may be flat in some embodiments. Blind channel ends may abut cross member 707. Fluid delivery block 702 may be machined from a block of material comprising metals such as, but not limited to, copper, nickel, aluminum or tungsten. In some embodiments, fluid delivery block 702 comprises a ceramic or a polymer composite. In some embodiments, fluid delivery block 702 is attached to microchannel block 703 as a partial assembly. As mentioned above, fluid delivery block 702 and microchannel block 703 may be integrally formed by a 3-D printing process. Dimensions of fluid delivery block 702 may be substantially the same as described above for fluid delivery block 602.

FIG. 7B illustrates a trimetric view of assembled DLMJ module 700, according to some embodiments of the disclosure.

In the illustrated embodiment, fluid delivery block 702, microchannel block 703 and cover 701 are assembled as DLMJ module 700. To show the components of contained within DLMJ module 700, cover 701 is transparent. Again, it will be appreciated that the cover material may not be transparent, and the illustrated embodiment is not limiting. In some embodiments, fluid delivery block 702 and microchannel block 703 are fit together as described above. Cover 701 may be pressed against central member 707 of fluid delivery block 702, forming a sealed partition between delivery manifold 708 and collection manifold 709.

Central member 707 may provide a fluid-tight seal between delivery manifold 708 and collection manifold 709. The vertical arrows pointing to and away from fluid ports 705 (e.g., 705a and 705b) show entry and exit of coolant from DLMJ module 700. As an example, fresh coolant may enter through fluid port 705a and distribute from delivery manifold 708 into the network of inlet channels 105a. Warmed coolant flows out of the network of outlet channels 105b into collection manifold 709, exiting DLMJ module 700 through fluid port 705b.

In some embodiments, DLMJ module 700 is seated in a support structure, such as chassis 110, shown in FIG. 1. In some embodiments, DLMJ module 700 seats directly over one or more IC dies (e.g., IC die 101) without a support structure.

Figure 8A:
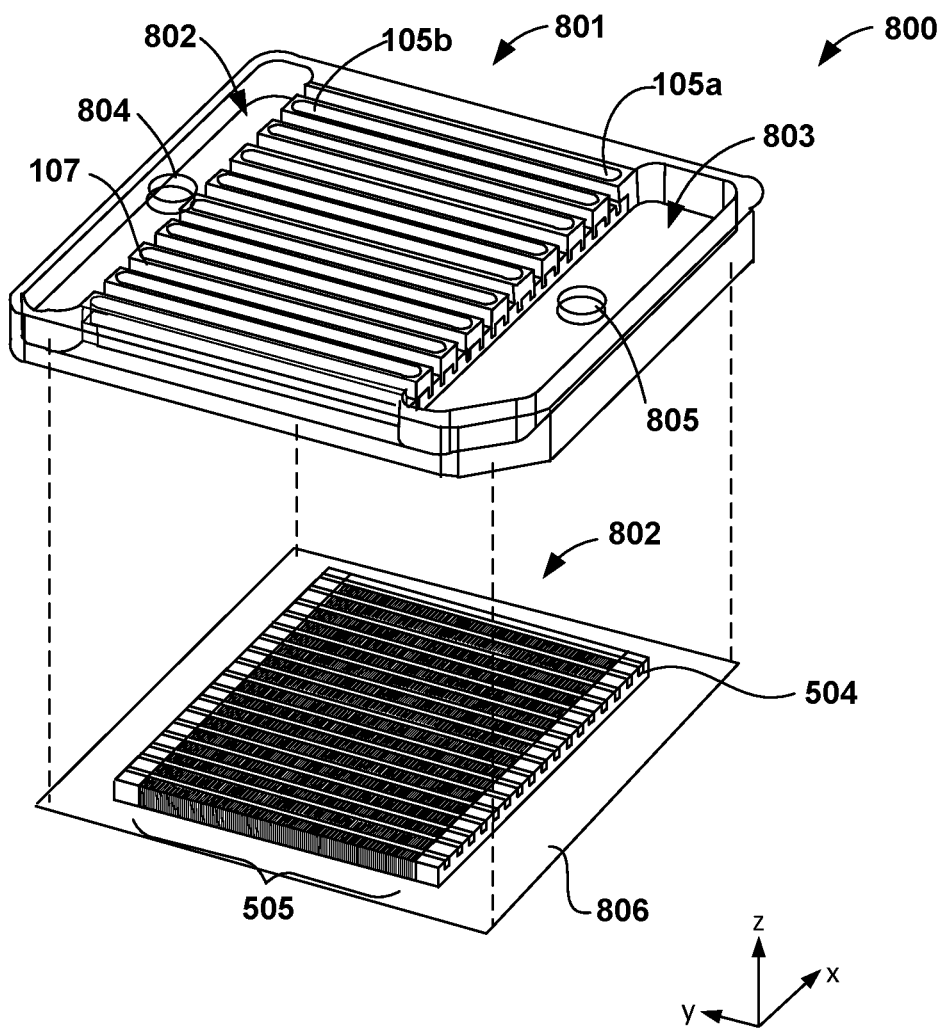
FIG. 8A illustrates an exploded trimetric view of a DLMJ module, according to some embodiments of the disclosure.

FIG. 8A illustrates an exploded trimetric view of DLMJ module 800, according to some embodiments of the disclosure.

Figure 8B:
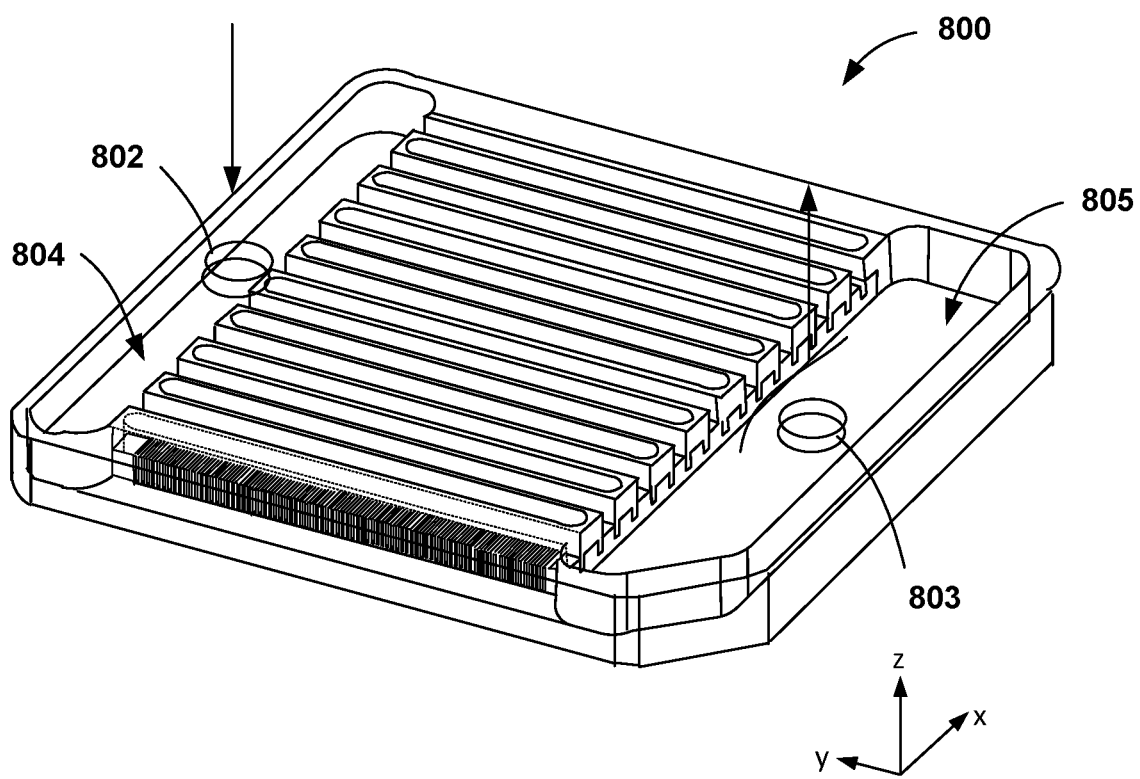
FIG. 8B illustrates a trimetric view of an assembled DLMJ module, according to some embodiments of the disclosure.

DLMJ module 800 comprises cover 801 within which fluid distribution channels 105, comprising inlet channels 105a and outlet channels 105b, are integrated. It will be appreciated that designation of particular fluid distribution channels 105 as inlet channel 105a or outlet channel 105b in FIG. 8A or 8B is exemplary, and not to be construed as limiting. Distribution manifold 802 and collection manifold 803 are integrated into cover 801 and disposed at opposing sides. It will be appreciated that designation of particular manifold shown in FIG. 8A or 8B as distribution manifold 802 or collection manifold 803 is exemplary, and not to be construed as limiting.

Inlet channels 105a extend laterally from distribution manifold 802, and outlet channels 105b extend in an opposed direction from collection manifold 803. In the illustrated embodiment, inlet channels 105a extend substantially to an inner edge of collection manifold 803 and outlet channels 105b extend substantially to an inner edge of distribution manifold 802. In alternate embodiments, inlet channels 105a and outlet channels 105b extend partially between distribution and collection manifolds 802 and 803, respectively. Sidewall 107 is integrated into cover 801. As shown in FIG. 2A, sidewall 107 is a continuous serpentine structure that separates inlet channels 105a from outlet channels 105b. In some embodiments, sidewall 107 extends from top surface to bottom surface of cover 801, and is flush with the bottom surface (in the x-y plane). In some embodiments, sidewall 107 extends beyond the bottom surface of cover 801.

Fluid distribution channels 105, as well as distribution manifold 802 and collection manifold 803, are structurally integrated into cover 801 so that cover 801 fluid distribution block are combined into a single unit. Cover 801 may be a molded piece, or formed from a machined block. Fluid ports 804 and 805 are disposed over distribution manifold 802 and collection manifold 803, respectively. In some embodiments, fluid ports 804 and 805 comprise threads for attaching external fittings. In some embodiments, fittings are integrated onto cover 801. Cover 801 comprises metallic materials such as, but not limited to, copper, steel, nickel, aluminum or tungsten. In some embodiments, cover 801 comprises non-metallic materials such as thermoplastics such as polyethylene or polypropylene, thermosetting plastics such as acrylonitrile butadiene styrene (ABS), polystyrenes, acrylics, polyethylene terephthalate (PET), ceramics or ceramic composites.

DLMJ module 800 further comprises microchannel block 802. In the illustrated embodiment, microchannel block 802 comprises microchannel array 505, as shown in FIG. 5C, which comprises baffles 504 as shown in FIGS. 5A-5C (see accompanying description). In alternate embodiments, microchannel block 801 comprises grooves (e.g., grooves 404, shown in FIG. 4D) that are to receive extended sidewalls 107, and rely on sidewalls 107 to provide baffles (e.g., baffles 301 shown in FIGS. 3 and 4A-4C). Microchannel block 802 may be machined from a metal block as described above. In some embodiments, microchannel block 802 may be a molded piece or produced by 3-D printing. In some embodiments, microchannel block 802 comprises materials including, but not limited to, copper, steel, nickel, aluminum, tungsten, ceramics, ceramic composites, or organic polymeric materials as described above.

FIG. 8B illustrates a trimetric view of assembled DLMJ module 800, according to some embodiments of the disclosure.

In the illustrated embodiment, DLMJ module 800 comprises an assembly of two components, cover 801 and microchannel block 802. To show the components of contained within DLMJ module 800, cover 801 is transparent. Again, it will be appreciated that the cover material may not be transparent, and the illustrated embodiment is not limiting. When assembled, cover 801 may seal over microchannel array 505, and base 806, enabling a fluid-tight structure preventing mixing of fresh and warmed coolant. In some embodiments, extended sidewalls 107 (e.g., as shown in FIGS. 4A-4C) may be inserted into grooves in microchannel block 802 (e.g., grooves 404) as part of the process of assembly of DLMJ module 800.

The vertical arrows pointing to and away from fluid ports 802 and 803 show entry and exit of coolant from DLMJ module 800. As an example, fresh coolant may enter through fluid port 802 and distribute from delivery manifold 804 into the network of inlet channels 105a. Warmed coolant flows out of the network of outlet channels 105b into collection manifold 805, exiting DLMJ module 800 through fluid port 803.

In some embodiments, DLMJ module 800 is seated in a support structure, such as chassis 110, shown in FIG. 1. In some embodiments, DLMJ module 800 seats directly over one or more IC dies (e.g., IC die 101) without a support structure.

Figure 9A:
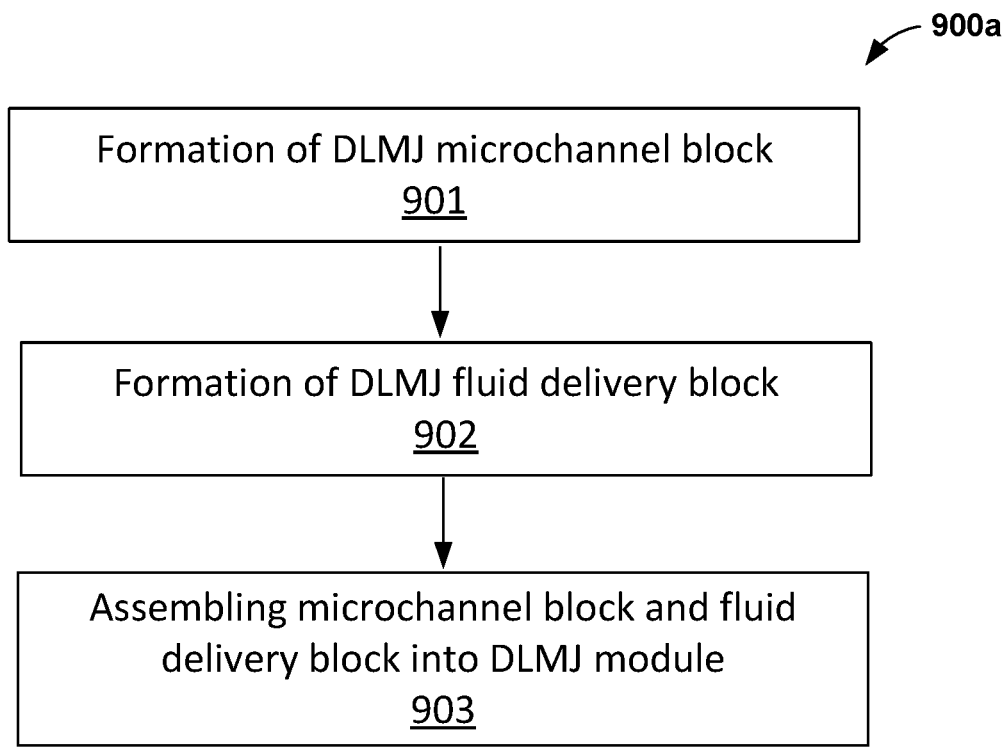
FIG. 9A illustrates a process flow chart describing an exemplary embodiment of a method of manufacture of DLMJ modular HXU, according to some embodiments of the disclosure.

FIG. 9A illustrates process flow chart 900a describing an exemplary method of manufacture of DLMJ module (e.g., DLMJ module 100, 600 or 700), according to some embodiments of the disclosure.

At operation 901, a microchannel block (e.g., microchannel block 402, 502, 603, 703 and 802) may be formed by laser machining of a solid block of material. Suitable materials have been described above. Microchannels (e.g., microchannels 201) may be formed by laser cutting of narrow slots (width of 0.5 mm to 2 mm). In some embodiments, a narrow rotating saw blade may be employed to cut microchannels in the block. In some embodiments, microchannels are formed in silicon by deep reactive ion etching (DRIE). In some embodiments, microchannel block may be formed by an additive method such as electrodeposition of a metal such as copper into a lithographically-defined mold (e.g., a LIGA-defined mold or a photo-pattered thick resist), or by a 3-D printing process.

The bottom of the fabricated microchannels is a heat transfer surface, such as cold plate 202. Microchannels formed in a metal block naturally have such as surface as part of the overall structure of the microchannel block. Microchannels formed in less thermally conductive materials may have a metal cold plate attached to the bottom of the microchannel block.

At operation 902, a fluid delivery block (e.g., fluid delivery block 401, 501, 602, 702) may be formed by machining processes, molding processes or by 3-D printing processes. The fluid delivery block may be formed from thermally insulating materials, such as thermoplastics, thermosetting plastics, ceramics or composites. In some embodiments, the fluid delivery block is machined from a metal block. Standard machining methods such as milling may be employed. In some embodiments, the fluid delivery block may be formed as a molded piece, or produced by a 3-D printing process.

At operation 903, the microchannel block and the fluid delivery block are assembled to form the DLMJ module. Assembly may be accomplished by alignment of the two blocks by a pick- and place operation. In some embodiments, assembly may be followed by brazing the blocks at strategic points. Referring to FIGS. 4A, 4B, 5A and 5B, sidewall 107 may be brazed to baffles 301, or to grooves 404. Wall 405 may be brazed to rim 406 of cold plate 202. In some embodiments, the microchannel block may be joined to the fluid delivery block by sealing compounds or adhesives.

Figure 9B:
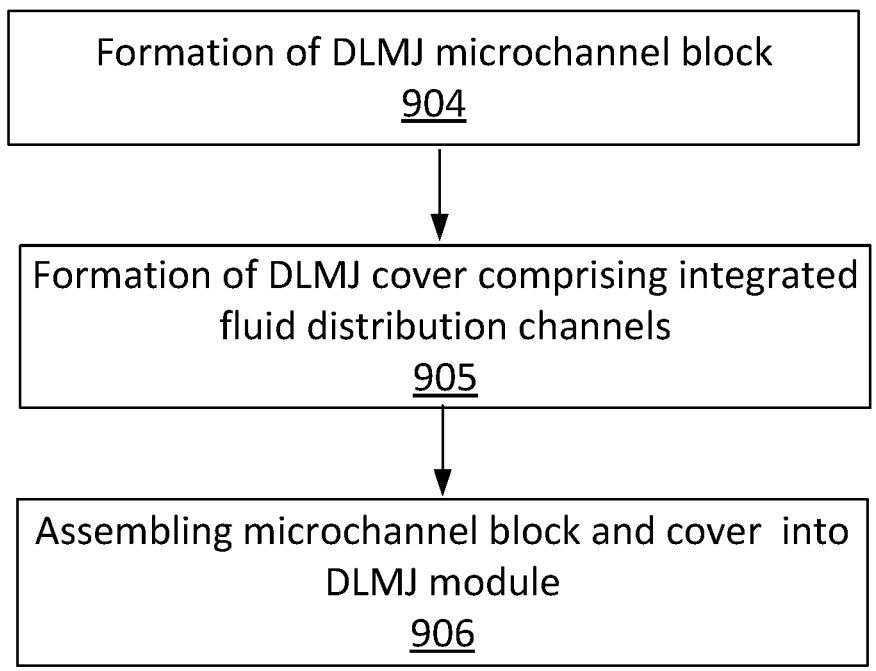
FIG. 9B illustrates a process flow chart describing an exemplary embodiment of a method of manufacture of a DLMJ modular HXU, according to some embodiments of the disclosure.

FIG. 9B illustrates process flow chart 900b describing an exemplary method of manufacture of DLMJ module (e.g., DLMJ module 800), according to some embodiments of the disclosure.

At operation 904, a microchannel block is formed. Various suitable methods have been described above, and may be employed here.

At operation 905, an integrated cover comprising integrated fluid delivery channels (e.g., cover 801) is formed by machining fluid delivery channels (e.g., see description of cover 801 and FIG. 8A) a solid block of material, according to some embodiments. Suitable materials may include metals, thermosetting plastics, thermoplastics, ceramics or composites. In some embodiments, the integrated cover is formed by a molding process. In some embodiments, the integrated cover is formed by a 3-D printing process.

At operation 906, the integrated cover and microchannel block are assembled into a complete DLMJ module.

Figure 10:
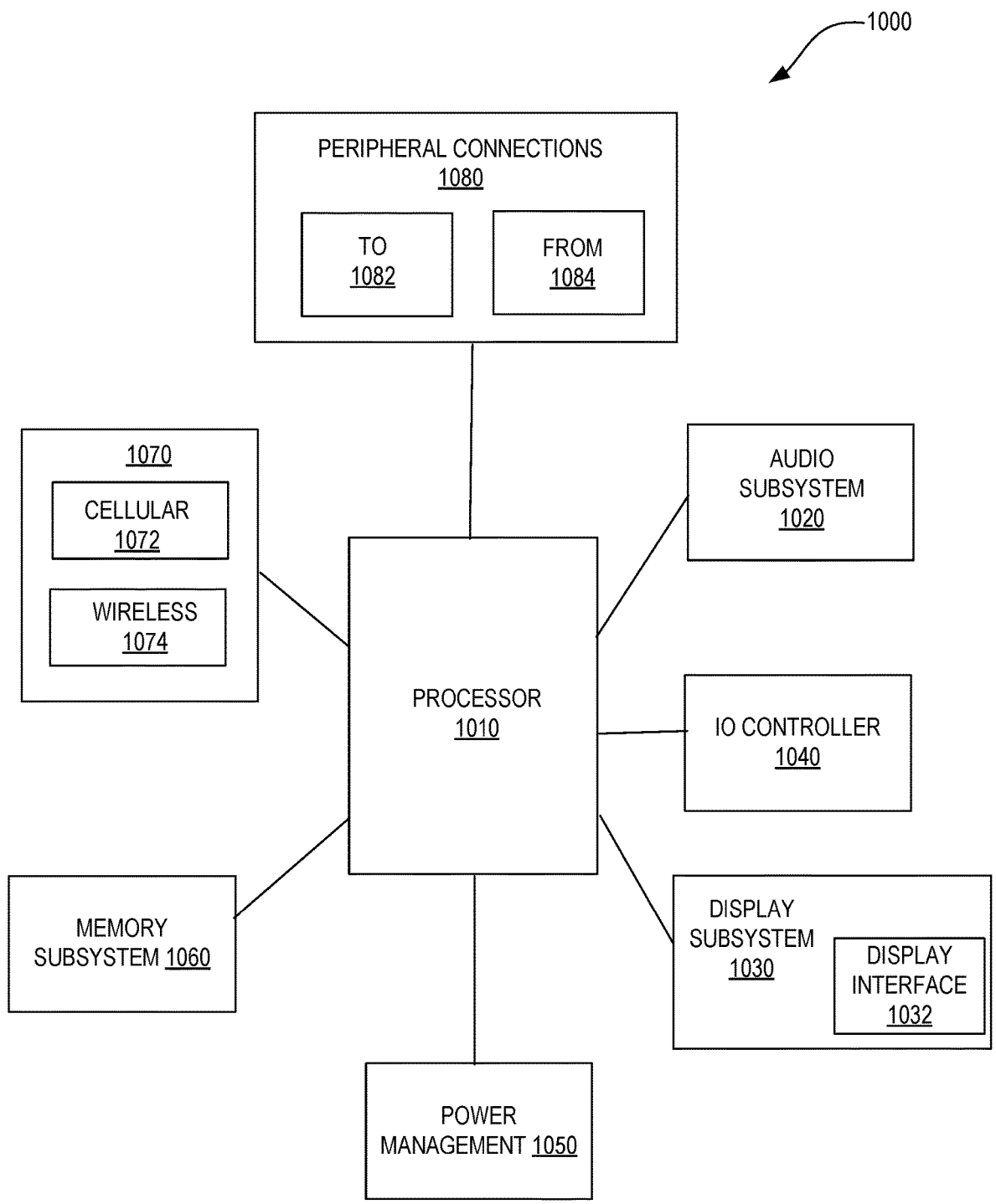
FIG. 10 illustrates a block diagram of a computing device comprising an integrated DLMJ modular HXU, as part of a system-on-chip (SoC) package in an implementation of a computing device, according to some embodiments of the disclosure.

FIG. 10 illustrates a block diagram of computing device 1000 comprising an integrated DLMJ HXU (e.g., DLMJ module 100, 600, 600, 800), as part of a system-on-chip (SoC) package (e.g., IC package 100) in an implementation of a computing device, according to some embodiments of the disclosure.

According to some embodiments, computing device 1000 represents a server, a desktop workstation, or a mobile workstation, such as, but not limited to, a laptop computer, a computing tablet, a mobile phone or smart-phone, a wireless-enabled e-reader, or other wireless mobile device. An IC package, such as, but not limited to, a single- or multi-core microprocessor (e.g., processor 1010 representing a central processing unit (CPU) or a graphical processing unit (GPU)), comprising one or more dies, is mounted on a motherboard of computing device 1000. The IC package may dissipate a large amount of heat, where a high-efficiency thermal solution is required. In addition, the IC package may have significant amount of warpage or otherwise exhibit significant non-planarity. According to some embodiments, computing device 1000 employs an IC package (e.g., package 100) DLMJ HXU (e.g., any one of DLMJ modules 600, 700, or 800) mounted between the IC package and a thermal solution, where the conformable heat sink interface conforms to the contours of the warped or otherwise non-planar IC package, making contact with substantially 100% of the surface of the IC package at significantly reduced load on the IC package in comparison with a conventional thermal solution, as described above.

In some embodiments, computing device has wireless connectivity (e.g., Bluetooth and/or WiFi). It will be understood that certain components are shown generally, and not all components of such a device are shown in computing device 1000.

The various embodiments of the present disclosure may also comprise a network interface within 1070 such as a wireless interface so that a system embodiment may be incorporated into a wireless device, for example, cell phone or personal digital assistant.

According to some embodiments, processor 1010 represents a CPU or a GPU, and can include one or more physical devices, such as microprocessors, application processors, microcontrollers, programmable logic devices, or other processing means. The processing operations performed by processor 1010 include the execution of an operating platform or operating system on which applications and/or device functions are executed. The processing operations include operations related to I/O (input/output) with a human user or with other devices, operations related to power management, and/or operations related to connecting the computing device 1000 to another device. The processing operations may also include operations related to audio I/O and/or display I/O.

In one embodiment, computing device 1000 includes audio subsystem 1020, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1000, or connected to the computing device 1000. In one embodiment, a user interacts with the computing device 1000 by providing audio commands that are received and processed by processor 1010.

Display subsystem 1030 represents hardware (e.g., display devices) and software (e.g., drivers) components that provide a visual and/or tactile display for a user to interact with the computing device 1000. Display subsystem 1030 includes display interface 1032 which includes the particular screen or hardware device used to provide a display to a user. In one embodiment, display interface 1032 includes logic separate from processor 1010 to perform at least some processing related to the display. In one embodiment, display subsystem 1030 includes a touch screen (or touch pad) device that provides both output and input to a user.

I/O controller 1040 represents hardware devices and software components related to interaction with a user. I/O controller 1040 is operable to manage hardware that is part of audio subsystem 1020 and/or display subsystem 1030. Additionally, I/O controller 1040 illustrates a connection point for additional devices that connect to computing device 1000 through which a user might interact with the system. For example, devices that can be attached to the computing device 1000 might include microphone devices, speaker or stereo systems, video systems or other display devices, keyboard or keypad devices, or other I/O devices for use with specific applications such as card readers or other devices.

As mentioned above, I/O controller 1040 can interact with audio subsystem 1020 and/or display subsystem 1030. For example, input through a microphone or other audio device can provide input or commands for one or more applications or functions of the computing device 1000. Additionally, audio output can be provided instead of, or in addition to display output. In another example, if display subsystem 1030 includes a touch screen, the display device also acts as an input device, which can be at least partially managed by I/O controller 1040. There can also be additional buttons or switches on the computing device 1000 to provide I/O functions managed by I/O controller 1040.

In one embodiment, I/O controller 1040 manages devices such as accelerometers, cameras, light sensors or other environmental sensors, or other hardware that can be included in the computing device 1000. The input can be part of direct user interaction, as well as providing environmental input to the system to influence its operations (such as filtering for noise, adjusting displays for brightness detection, applying a flash for a camera, or other features).

In one embodiment, computing device 1000 includes power management 1050 that manages battery power usage, charging of the battery, and features related to power saving operation. Memory subsystem 1060 includes memory devices for storing information in computing device 1000. Memory can include nonvolatile (state does not change if power to the memory device is interrupted) and/or volatile (state is indeterminate if power to the memory device is interrupted) memory devices. Memory subsystem 1060 can store application data, user data, music, photos, documents, or other data, as well as system data (whether long-term or temporary) related to the execution of the applications and functions of the computing device 1000.

Elements of embodiments are also provided as a machine-readable medium (e.g., memory 1060) for storing the computer-executable instructions. The machine-readable medium (e.g., memory 1060) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 1070 includes hardware devices (e.g., wireless and/or wired connectors and communication hardware) and software components (e.g., drivers, protocol stacks) to enable the computing device 1000 to communicate with external devices. The computing device 1000 could be separate devices, such as other computing devices, wireless access points or base stations, as well as peripherals such as headsets, printers, or other devices.

Network interface 1070 can include multiple different types of connectivity. To generalize, the computing device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1074 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1080 include hardware interfaces and connectors, as well as software components (e.g., drivers, protocol stacks) to make peripheral connections. It will be understood that the computing device 1000 could both be a peripheral device ("to" 1082) to other computing devices, as well as have peripheral devices ("from" 1084) connected to it. The computing device 1000 commonly has a "docking" connector to connect to other computing devices for purposes such as managing (e.g., downloading and/or uploading, changing, synchronizing) content on computing device 1000. Additionally, a docking connector can allow computing device 1000 to connect to certain peripherals that allow the computing device 1000 to control content output, for example, to audiovisual or other systems.

In addition to a proprietary docking connector or other proprietary connection hardware, the computing device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A heat exchange module, comprising:
   an array of microchannels over a cold plate, wherein the microchannels extend in a first direction and are separated from one another by microchannel fins;
   a first manifold and a second manifold;
   an array of first fluid distribution channels over the microchannels and extending in a second direction substantially orthogonal to the first direction, wherein the first fluid distribution channels extend from the first manifold and terminate between the first and second manifolds; and
   an array of second fluid distribution channels over the microchannels, wherein the second fluid distribution channels are parallel to and interleaved with the first fluid distribution channels, wherein the second fluid distribution channels extend from the second manifold and terminate between the first and second manifolds, and wherein the first and second fluid distribution channels are separated by sidewalls,
   wherein the first and second fluid distribution channels are fluidically coupled to the microchannels, and wherein baffles extend into the array of microchannels below the sidewalls separating the first and second fluid distribution channels.

2. The heat exchange module of claim 1, wherein the baffles are within notches in the microchannels.

3. The heat exchange module of claim 2, wherein portions of the baffles within the notches comprise rounded edges.

4. The heat exchange module of claim 1, wherein the baffles extend across a width of the microchannels.

5. The heat exchange module of claim 1, wherein the first fluid distribution channels have a first end and a second end, wherein the first fluid distribution channels are fluidically coupled to the first manifold at the first end and are terminated by caps at the second end.

6. The heat exchange module of claim 5, wherein the caps are curved or straight.

7. The heat exchange module of claim 1, further comprising a cover, a fluid delivery block under the cover, and a microchannel block under the fluid delivery block, wherein:
the cover comprises a lid and a wall extending from edges of the lid, wherein the first manifold is on a first side of the cover, and the second manifold is on a second side of the cover, and
the fluid delivery block comprises the first and second fluid distribution channels.

8. The heat exchange module of claim 1, further comprising a cover, a fluid delivery block, and a microchannel block, wherein:
the cover comprises a lid and a wall extending from edges of the lid, wherein the first manifold is on a first side of the cover, and the second manifold is on a second side of the cover, and
the fluid delivery block comprises the first and second fluid distribution channels, wherein a central member is between the first and second fluid distribution channels, the central member having a z-height over the first array and the second array, and wherein the central member is abutted against the lid of the cover.

9. The heat exchange module of claim 1, further comprising a cover over a microchannel block, wherein:
the cover comprises a lid and a wall extending from edges of the lid, wherein the first manifold is integrated on a first side of the cover, and the second manifold is integrated on a second side of the cover.

10. The heat exchange module of claim 1, wherein the microchannel fins or the sidewalls comprise copper, steel, stainless steel, nickel, aluminum, tungsten, polyethylene or polypropylene, acrylonitrile butadiene styrene (ABS), polystyrenes, acrylics, polyethylene terephthalate (PET), ceramics, or ceramic composites.

11. A system, comprising:
an integrated circuit (IC) die on a substrate;
a heat exchange module over the IC die, wherein the heat exchange module comprises:
an array of microchannels over a cold plate, wherein the microchannels extend in a first direction and are separated from one another by microchannel fins;
a first manifold and a second manifold;
an array of first fluid distribution channels over the microchannels and extending in a second direction substantially orthogonal to the first direction, wherein the first fluid distribution channels extend from the first manifold and terminate between the first and second manifolds; and
an array of second fluid distribution channels over the microchannels, wherein the second fluid distribution channels are parallel to and interleaved with the first fluid distribution channels, wherein the second fluid distribution channels extend from the second manifold and terminate between the first and second manifolds, and wherein the first and second fluid distribution channels are separated by sidewalls,
wherein the first and second fluid distribution channels are fluidically coupled to the microchannels, and wherein baffles extend into the array of microchannels below the sidewalls separating the first and second fluid distribution channels;
a fluidic circuit coupled to the first manifold and to the second manifold, wherein the fluidic circuit comprises a pump to pump a coolant; and
a power supply coupled to the IC die.

12. The system of claim 11, wherein the coolant comprises water, alcohols, ethylene glycol, nitrogen, helium, or argon.

13. The system of claim 11, wherein the heat exchange module is mounted on a chassis that supports the heat exchange module over the IC die.

14. The system of claim 11, wherein the IC die comprises a microprocessor.

15. The system of claim 11, wherein the cold plate is directly contacted to the IC die, or a thermal interface material is between the IC die and the cold plate.

16. A heat exchange module, comprising:
an array of microchannels over a cold plate, wherein the microchannels extend in a first direction and are separated from one another by microchannel fins; and
an array of fluid distribution channels over the array of microchannels, wherein the fluid distribution channels extend in a second direction substantially orthogonal to the first direction, and wherein the fluid distribution channels are separated by sidewalls,
wherein the fluid distribution channels are fluidically coupled to the array of microchannels, wherein one or more baffles extend into the array of microchannels below the one or more sidewalls separating the fluid distribution channels, and wherein the baffles extend in the second direction.

17. The heat exchange module of claim 16, wherein the microchannel fins comprise notches to receive the one or more baffles.

18. The heat exchange module of claim 17, wherein the one or more baffles comprise extension of the one or more sidewalls.

19. The heat exchange module of claim 17, wherein the one or more baffles comprise insertion bars within the notches, and wherein the insertion bars and sidewalls are separate structures.

20. The heat exchange module of claim 16, wherein the microchannel fins or the sidewalls comprise copper, steel, stainless steel, nickel, aluminum, tungsten, polyethylene or polypropylene, acrylonitrile butadiene styrene (ABS), polystyrenes, acrylics, polyethylene terephthalate (PET), ceramics, or ceramic composites.

* * * * *